US010367034B2

(12) United States Patent
Lin et al.

(10) Patent No.: US 10,367,034 B2
(45) Date of Patent: Jul. 30, 2019

(54) LUMINAIRE UTILIZING A TRANSPARENT ORGANIC LIGHT EMITTING DEVICE DISPLAY

(71) Applicant: ABL IP HOLDING LLC, Conyers, GA (US)

(72) Inventors: Guan-Bo Lin, Reston, VA (US); An Mao, Reston, VA (US); Ravi Kumar Komanduri, Dulles, VA (US); David P. Ramer, Reston, VA (US); Rashmi Kumar Raj, Herndon, VA (US)

(73) Assignee: ABL IP HOLDING LLC, Conyers, GA (US)

( * ) Notice: Subject to any disclaimer, the term of this patent is extended or adjusted under 35 U.S.C. 154(b) by 309 days.

(21) Appl. No.: 15/176,623

(22) Filed: Jun. 8, 2016

(65) Prior Publication Data

US 2017/0294488 A1 Oct. 12, 2017

Related U.S. Application Data

(62) Division of application No. 15/095,192, filed on Apr. 11, 2016.

(51) Int. Cl.
*H01L 27/32* (2006.01)
*H01L 51/52* (2006.01)
(Continued)

(52) U.S. Cl.
CPC .......... *H01L 27/3209* (2013.01); *F21V 14/00* (2013.01); *G02F 1/29* (2013.01); *H01L 27/326* (2013.01); *H01L 27/3211* (2013.01); *H01L 27/3232* (2013.01); *H01L 27/3248* (2013.01); *H01L 27/3262* (2013.01); *H01L 27/3265* (2013.01); *H01L 27/3276* (2013.01); *H01L 27/3288* (2013.01); *H01L 51/5271* (2013.01); *H01L 27/124* (2013.01);
(Continued)

(58) Field of Classification Search
CPC ... H01L 27/3209; H01L 27/3265; F21V 14/00
See application file for complete search history.

(56) References Cited

U.S. PATENT DOCUMENTS 5,757,139 A * 5/1998 Forrest ..................... G09G 3/14
 313/504
5,917,280 A * 6/1999 Burrows ............. H01L 27/3209
 313/503

(Continued)

OTHER PUBLICATIONS

Planar 9 Things You Need to Know About Tansparent OLED downloaded from http:/www.planar.com/products/tansparent-displays/, Nov. 9, 2015, 18 pages.
(Continued)

*Primary Examiner* — Joseph L Williams
(74) *Attorney, Agent, or Firm* — RatnerPrestia

(57) ABSTRACT

The examples relate to various implementations of a software configurable luminaire and a transparent display device for use in such a luminaire. The luminaire is able to generate light sufficient to provide general illumination of a space in which the luminaire is installed and provide an image display. The general illumination is provided by additional light sources and/or improved display components of the transparent display device.

20 Claims, 14 Drawing Sheets

(51) Int. Cl.
    *F21V 14/00*     (2018.01)
    *G02F 1/29*     (2006.01)
    *H01L 27/12*     (2006.01)

(52) U.S. Cl.
    CPC ...... *H01L 27/1214* (2013.01); *H01L 27/1255* (2013.01); *H01L 2251/5361* (2013.01)

(56) References Cited

U.S. PATENT DOCUMENTS

| | | | |
|---|---|---|---|
| 6,882,010 B2 | 4/2005 | Bhattacharyya | |
| 7,098,591 B1 | 8/2006 | Zhu et al. | |
| 7,247,394 B2* | 7/2007 | Hatwar | H01L 51/5265 257/89 |
| 7,327,081 B2* | 2/2008 | Lo | H01L 51/5271 313/504 |
| 7,494,722 B2* | 2/2009 | Liao | H01L 51/5278 257/E51.022 |
| 8,177,390 B2 | 5/2012 | Miskin | |
| 2004/0130516 A1 | 7/2004 | Nathan et al. | |
| 2007/0046190 A1* | 3/2007 | Lo | H01L 51/5271 313/506 |
| 2008/0137008 A1 | 6/2008 | Rogojevic et al. | |
| 2008/0268282 A1 | 10/2008 | Spindler et al. | |
| 2010/0046210 A1 | 2/2010 | Mathai et al. | |
| 2010/0187988 A1* | 7/2010 | Forrest | C09K 11/06 313/504 |
| 2014/0110672 A1 | 4/2014 | Hack | |
| 2015/0200378 A1 | 7/2015 | Reusch et al. | |

OTHER PUBLICATIONS

Fraunhofer COMEDD, Color-Tunable OLED, downloaded from http://www.comedd.fraunhofer.de/content/dam/comedd/common/products/COMEDD/famos-e.pdf, Nov. 9, 2015, 2 pages.
U.S. Appl. No. 15/209,878, filed Jul. 14, 2016, 78 pages.
U.S. Appl. No. 15/210,045, filed Jul. 14, 2016, 77 pages.
U.S. Appl. No. 15/210,328, filed Jul. 14, 2016, 51 pages.
U.S. Appl. No. 62/204,606, filed Aug. 13, 2015, 91 pages.
U.S. Appl. No. 62/209,546, filed Aug. 25, 2015, 102 pages.
U.S. Appl. No. 62/262,071, filed Dec. 2, 2015, 65 pages.
Non Final Office Action for U.S. Appl. No. 15/095,192, dated Mar. 13, 2018, 19 pages.
Final Office Action for U.S. Appl. No. 15/095,192, dated Aug. 8, 2018, 13 pages.
Notice of Allowance for U.S. Appl. No. 15/095,192, dated Nov. 19, 2018, 8 pages.

* cited by examiner

LUMINAIRE UTILIZING A TRANSPARENT ORGANIC LIGHT EMITTING DEVICE DISPLAY

CROSS-REFERENCE TO RELATED APPLICATION

This application is a divisional of U.S. patent application Ser. No. 15/095,192, filed on Apr. 11, 2016, the entire disclosure of which is incorporated herein by reference.

TECHNICAL FIELD

The present subject matter relates to luminaires that provide general illumination, and are software configurable to present images utilizing a transparent organic light emitting device (OLED) display as well as to transparent OLED displays and elements for use in such displays.

BACKGROUND

Electrically powered artificial lighting has become ubiquitous in modern society. Electrical lighting devices are commonly deployed, for example, in homes, commercial buildings and other enterprise establishments, as well as in various outdoor settings.

Lighting devices take many forms, for example, ranging from aesthetically appealing residential use luminaires to ruggedized industrial lighting devices configured according to the environment in which the luminaire is located. A primary function of a lighting device is to provide general illumination that complies with governmental regulations and industry standards applicable to the environment in which the lighting device is installed.

Examples of other uses of lighting in combination with display technologies includes various configurations of signage that include light sources as backlighting that are positioned behind a design feature such a diffuser or screen with an image or wording. Examples of such backlit signage includes advertising signs, door exit signs and other examples of signage that would benefit from backlighting. Some of the signs may be controllable to change wording or an image presented on the display device of the sign. In some instances of advertising signage, a transparent display can be used to provide advertising without obstructing a view of either the interior of a store when viewed from the exterior or vice versa, as well as providing an easily changeable design. However, backlit signage without additional lighting is not typically configured to provide general illumination that complies with governmental regulations and industry standards applicable to the environment in which the signage is installed.

There have been more recent proposals to develop transparent displays using organic light emitting devices (OLEDs) for purposes of providing augmented reality experiences, and to provide smart windows, doors or even furniture. However, due to the construction of these transparent displays, the optical transmissivity of some of these displays is only 45% with a pixel size of 0.63 millimeters. This lack of transmissivity hinders full utilization of the transparent attributes of the transparent display for purposes other than the augmented reality experience or as smart windows.

Although more recent transparent display proposals provide a greater transmissivity than previous attempts, the transmissivity of the transparent display device may be further improved to provide greater transmissivity.

Recent developments in the use of OLED devices have enabled color tunable light sources. In an example, the Fraunhofer Institute has also shown that a tunable OLED device that emits a range of different colors may be formed by arranging different color light emitting OLEDs over one another. The OLED described by the Fraunhofer Institute is used in a lighting device to provide tunable light ranging from a warm yellow color to a cooler blue color.

Furthermore, there have been proposals to use displays or display-like devices mounted in or on the ceiling to provide variable lighting. The Fraunhofer Institute, for example, has demonstrated a lighting system using luminous tiles, each having a matrix of red (R) LEDs, green (G), blue (B) LEDs and white (W) LEDs as well as a diffuser film to process light from the various LEDs. The LEDs of the system were driven to simulate or mimic the effects of clouds moving across the sky. Although use of displays with a lighting device allows for variations in appearance that some may find pleasing, the displays or display-like devices are optimized for image output and do not provide particularly good illumination for general lighting applications.

Opportunities exist to improve upon the transmissivity of transparent OLED display devices for various applications, including for use as (or as part of) a lighting device.

BRIEF DESCRIPTION OF THE DRAWINGS

The drawing figures depict one or more implementations in accord with the present concepts, by way of example only, not by way of limitations. In the figures, like reference numerals refer to the same or similar elements.

DETAILED DESCRIPTION

Figure 1:
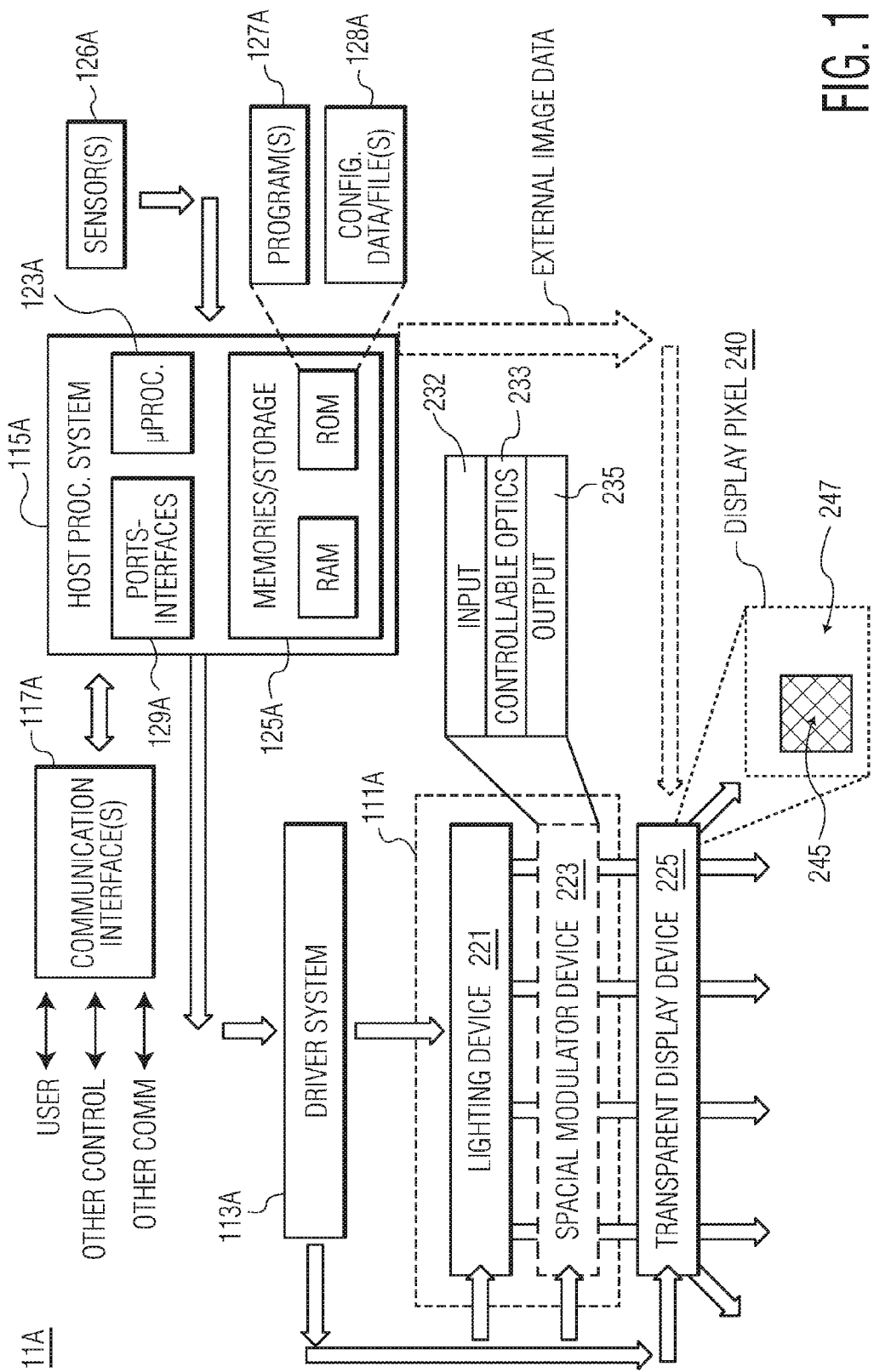
FIG. 1 is high-level functional block diagram of an example of a lighting device of luminaire and associated driver and processing components.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The various examples disclosed herein relate to a transparent display device that generates an image but still permits subject matter behind the transparent display to be visible to an observer of the image presented on the transparent display. The examples described in detail below and shown in the drawings typically implement one or more techniques to enhance the transmissivity over currently existing transparent display technologies. The increase in transparency may be beneficial in many applications, including applications of the display per se. The improved display also supports a dual functionality of a display and luminaire, particularly in a manner to more effectively support luminaire type general lighting applications.

Throughout the detailed description, various terms will be used to describe elements of the display, etc. that the reader may find help if described at the outset. For example, as used herein, a display pixel refers to an OLED or a combination of two or more OLEDs that emit light, including OLEDs in a stacked arrangement or in combination of stacked and unstacked OLED structures, and that includes an area through which light passes substantially unobstructed, which is referred to as a transparent region or area. As used herein, the term "transparent" refers to a material having an optical transmissivity substantially equal to or greater than 35%. So, for example, a transparent display panel would be a display panel that has a transmissivity greater than 35%. Examples of technologies are discussed below that alone or in various combinations raise the transmissivity of the transparent display panel above this minimum and above levels achieved in existing display panels, particularly such panels using OLED-based pixels. When considered in the aggregate of a transparent display panel, a transparent area that comprises only glass and encapsulation may have a light transmissivity greater than 80%. A larger transparent area of the display panel leads not only to higher overall transparency, but also a comparatively lesser usage of OLED devices and transparent conductor materials.

The materials of the transparent, or clear, area(s) of the display pixels will be substantially transparent and/or will produce relatively little or no diffraction of light passing through the display device from the back going forward into the same area of illumination as light emitted from the OLEDs of the display pixels of the panel. For visible display and illumination applications, for example, the transparent (i.e. clear) area(s) of the display pixels will have a relatively high optical transmissivity with respect to at least a substantial portion of the visible light spectrum, so as to appear clear or transparent to a human observer. Although the transparent area(s) may be transparent with respect to almost all of or the entire visible spectrum, or even the visible spectrum as well as some adjacent spectra of light, e.g. also infrared (IR) light and/or ultraviolet (UV) light, the transparent area(s) typically will be at least substantially transparent with respect to the same colors of light emitted by the OLEDs of the pixel display pixels of the panel (although in the examples, the OLED emissions need not pass through the transparent area(s)). The degree of transparency of the transparent area(s) of a display panel, e.g. transmissivity with respect to the relevant visible light, will at least be somewhat higher than that of the OLEDs of the pixel display pixels of the panel. For example, the transparent area(s) of the display panel may be formed of glass and an appropriate encapsulation so as to exhibit light transmissivity greater than 80% over the visible light spectrum.

Reference now is made in detail to the examples illustrated in the accompanying drawings and discussed below. A high level example of a luminaire 11A as disclosed herein includes a lighting device 221 that emits general illumination light, a spatial modulator device 223, collectively referred to as the controllable lighting system 111A, and a transparent display device 225. In addition, our example of the luminaire 11A includes other various components such as a driver system 113A, a host processor system 115A, and a communication interface 117A.

The controllable lighting system 111A and the transparent display device 225 will now be described in more detail in the context of the luminaire 11A. The controllable lighting system 111A, in this example, includes a lighting device 221 that emits general illumination light and a spatial modulator device 223 that processes light emitted by the lighting device 221 by providing beam shaping and/or beam steering functionality. The lighting device 221 may be any light source suitable to emit general illumination light of a sufficient intensity that the luminaire 11A complies with governmental guidelines or regulations and/or with industry standards. The example of luminaire 11A is highly configurable/controllable, therefore the lighting device 221 is a type that is readily controllable, for example, with respect to luminance output intensity and possibly other lighting parameters such as parameters relating to the spectral characteristics of the illumination light. For example, the lighting device 221 may be a controllable backlight that is configured to output light in a fixed or selectable direction. Examples of the lighting device 221 include various conventional lamps, such as incandescent, fluorescent or halide lamps; one or more light emitting diodes (LEDs) of various types, such as planar LEDs, micro LEDs, micro organic LEDs, LEDs on gallium nitride (GaN) substrates, micro nanowire or nanorod LEDs, photo pumped quantum dot (QD) LEDs, micro plasmonic LED, micro resonant-cavity (RC) LEDs, and micro photonic crystal LEDs; as well as other sources such as super luminescent Diodes (SLD) and micro laser diodes. Of course, these light generation technologies are given by way of non-limiting examples, and other light generation technologies may be used to implement the lighting device 221.

The spatial modulator device 223 processes light input into the device 223 and outputs light having a specified beam shape and/or beam direction. The spatial modulator 223, for example, includes an input 232, controllable optics 233 and an output 235. The spatial modulator input 232 receives the general illumination light emitted by the lighting device 221, the controllable optics 233 spatially process the input general illumination light, and the processed general illumination light is output via the output. The transparent display device 225 of the example luminaire 11A may be optically coupled to the output 235 of the spatial modulator device 223. The transparent display device 225, due to its transparent characteristics, allows a substantial quantity (e.g. 35% or higher amounts discussed in more detail later) of the processed general illumination light to pass through the display device 225 and out to the environment in which the luminaire is located.

The transparent display 225 is configured to output a display image. The transparent display device 225 includes an array of display pixels, such as display pixel 240. Each display pixel 240 of the array of display pixels includes a number of separately controllable, organic light emitting devices (OLEDs) 245 and transparent areas 247 in-between the OLEDs 245 of the transparent device 225. The transparent areas 247 are formed from a transparent material, such as glass or other material that provide similar optical performance. For example, if the glass or the like is used as a substrate for the display panel, the OLEDs 245, each of a limited area; and regions 247 of the transparent substrate in-between the OLEDs form display pixels 240.

At a high-level, the transparent display device 225 outputs a display image in response to control signals received from the driver system 113A. The displayed image may be a real scene, a computer generated scene, a single color, a collage of colors, a video stream, or the like. In addition or alternatively, the image data may be provided to the transparent display device 225 from an external source(s) (not shown), such as a remote server or an external memory device via one or more of the communication interfaces 117A. The functions of elements 111A and 225 are controlled by the control signals received from the driver system 113A. Similarly, the lighting device 221 provides general illumination lighting in response to control signals and/or image data received from the driver system 113A.

The lighting device 221 and the spatial modulator device 223, although shown in combination as controllable lighting system 111A, may be configured as separate controllable devices that for ease of explanation are generally referred to as the controllable lighting system 111A.

As shown in FIG. 1, the spatial modulator device 223 is positioned in the light output pathway of the lighting device 221. In general, the spatial modulator device 223 may include an input 232, controllable optics 233 and an output 235. In the example, the input 232, controllable optics 233 and the output 235 are coupled to one another to enable the light emitted by the lighting device 221 to pass through the spatial modulator device 223. Examples of controllable optics 233 usable as a spatial modulator device 223 in the luminaire 11A are described in detail in one or more of U.S. Provisional Application Ser. Nos. 62/193,859; 62/193,870; 62/193,874; 62/204,606; 62/209,546; and 62/262,071, the contents of all of which are incorporated in their entirety herein by reference. The input 232, for example, receives the general illumination light emitted by the lighting device 221, passes the inputted general illumination light to the controllable spatial modulator device 233. The controllable spatial modulator device 233 spatially processes the inputted general illumination light. The processed general illumination light is output via output 235 and passed through the transparent display device 225 to provide general illumination to the environment in which the luminaire 11A is located, for example, an illumination area within, overlapping with or encompassing an area from which a person may view the image presented by the display device 225. In some examples, the controllable spatial modulator device 233 is optional, and/or may be integrated in, or with, the lighting device 221 or the display 225.

In general, a controller, such as microprocessor 123A is coupled to the transparent display device 225, and is configured to control the OLEDs 245 of the display pixels 240 of the transparent display device 225 to generate an image display by sending control signals to the display device 225. The controller is also configured to control the lighting device 221 by sending control signals corresponding to general illumination settings, such as brightness, color and the like, for the lighting device 221. Similarly, the controller is coupled to the spatial modulator device 223 and is configured to control the controllable optics 233 to process the general illumination light input from the lighting device 221.

In a specific example, the microprocessor 123A receives a configuration file 128A via one or more of communication interfaces 117A. The processor 123 may store, or cache, the received configuration file 128 in storage/memories 125. The configuration file 128A includes configuration data that indicates, for example, an image for display by the transparent display device 225 as well as lighting settings for light to be provided by the configurable lighting device 11. Using the indicated image data, the processor 123A may retrieve from memory 125A stored image data, which is then delivered to the driver system 113A. The driver system 113A may deliver the image data directly to the transparent display device 225 for presentation or may convert the image data into a format suitable for delivery to the transparent display device 225. If not included in the configuration file for illumination, the image information for presentation on the display device 225 may be provided separately, e.g. as a separate image file or as a video stream.

In another example, if the transparent display device 225 operates in cooperation with the controllable lighting system 111A according to configuration data obtained from a configuration file associated with the luminaire 11A. Each configuration file also includes software control data to enable setting of light output parameters of the software configurable lighting device at least with respect to the controllable lighting system 111A.

The processor 123A by accessing programming 127A and using software configuration information 128A, from the storage/memories 125A, controls operation of the driver system 113A, and through that system 113A controls the controllable lighting system 111A. For example, the processor 123A obtains distribution control data from a configuration file 128A, and uses that data to control the driver system 113A to cause the display of an image via the transparent display device 225. The processor 123A by accessing programming 127A and using software configuration information 128A also sets operating states of the light generation and modulation components 221, 223 of the controllable lighting system 111A to generate illumination and to optically, spatially modulate output of a light source (not shown) of the lighting device 221 to produce a selected light distribution, e.g. to achieve a predetermined image presentation and a predetermined light distribution for a general illumination application of a luminaire.

In other examples, the driver system 113A is coupled to the memory 125A, the transparent display device 225 and the controllable lighting system 111A to control light generated by the transparent display device 225 and the controllable lighting system 111A based on the configuration data 128A stored in the memory 125A. In such an example, the driver system 113A is configured to access configuration data 128A stored in the memory 125A and generate control signals for presenting the image on the transparent display device 225 and control signals for generating light for output from the general illumination device 111A.

FIG. 1 also provides an example of an implementation of the high layer logic and communications elements and one or more drivers to drive the source 110A and the spatial modulator 223 to provide a selected light output distribution, e.g. for a general illumination application. As shown in FIG. 1, the lighting device 11A may also include a host processing system 115A, one or more sensors 121A and one or more communication interface(s) 117A.

The host processing system 115A provides the high level logic or "brain" of the device 11. In the example, the host processing system 115A includes data storage/memories 125A, such as a random access memory and/or a read-only memory, as well as programs 127A stored in one or more of the data storage/memories 125A. The data storage/memories 125A store various data, including lighting device configuration information 128A or one or more configuration files containing such information, in addition to the illustrated programming 127A. The host processing system 115A also includes a central processing unit (CPU), shown by way of example as the microprocessor (µP) 123A, although other processor hardware may serve as the CPU.

The ports and/or interfaces 129A couple the microprocessor 123A to various elements of the device 11A logically outside the host processing system 115A, such as the driver system 113A, the communication interface(s) 117A and the sensor(s) 121A. For example, the processor 123A by accessing programming 127A in the memory 125A controls operation of the driver system 113A and other operations of the lighting device 11A via one or more of the ports and/or interfaces 129A. In a similar fashion, one or more of the ports and/or interfaces 129A enable the processor 123A of the host processing system 115A to use and communicate externally via the interfaces 117A; and the one or more of the ports 129A enable the processor 123A of the host processing system 115A to receive data regarding any condition detected by a sensor 121A, for further processing. For example, one or more of sensors 121A may be positioned behind transparent display panel 225 to enable detection of conditions related to the environment in which the device 11A is located. It is envisioned that sensors 121A such as a camera, a light detector, a time of flight sensor, an ambient color light detector, light communication detectors and emitters, a fluorescent analysis sensor, a spectrometer and the like. The sensor(s) 121A may provide information to other devices, such as 11A as well as a building automation system, an air conditioning system, or the like. In addition or alternatively, the sensor(s) 121A may communicate with systems external to the environment in which the device 11A is located via the interfaces 117A.

In the examples, based on its programming 127A, the processor 123A processes data retrieved from the memory 123A and/or other data storage, and responds to light output parameters in the retrieved data to control the light generation and distribution system 111A. The light output control also may be responsive to sensor data from a sensor 121A. The light output parameters may include light intensity and light color characteristics in addition to spatial modulation (e.g. steering and/or shaping and the like for achieving a desired spatial distribution).

As noted, the host processing system 115A is coupled to the communication interface(s) 117A. In the example, the communication interface(s) 117A offer a user interface function or communication with hardware elements providing a user interface for the device 11A. The communication interface(s) 117A may communicate with other control elements, for example, a host computer of a building control and automation system (BCAS). The communication interface(s) 117A may also support device communication with a variety of other systems of other parties, e.g. the device manufacturer for maintenance or an on-line server for downloading of virtual luminaire configuration data.

As outlined earlier, the host processing system 115A also is coupled to the driver system 113A. The driver system 113A is coupled to the light source 221 and the spatial modulator 223 to control one or more operational parameter(s) of the light output generated by the source 221 and to control one or more parameters of the modulation of that light by the spatial modulator 223.

The host processing system 115A and the driver system 113A provide a number of control functions for controlling operation of the lighting device 11A. In a typical example, execution of the programming 127A by the host processing system 115A and associated control via the driver system 113A configures the lighting device 11 to perform functions, including functions to operate the light source 221 to provide light output from the lighting device and to operate the spatial modulator 223 to steer and/or shape the light output from the lighting device 221 so as to distribute the light output from the lighting device 11A based on the lighting device configuration information 128A.

The device 11A is not size restricted. For example, each device 11A may be of a standard size, e.g., 2-feet by 2-feet (2×2), 2-feet by 4-feet (2×4), or the like, and arranged like tiles for larger area coverage. Alternatively, the device 11A may be a larger area device that covers a wall, a part of a wall, part of a ceiling, an entire ceiling, or some combination of portions or all of a ceiling and wall.

Figure 2:
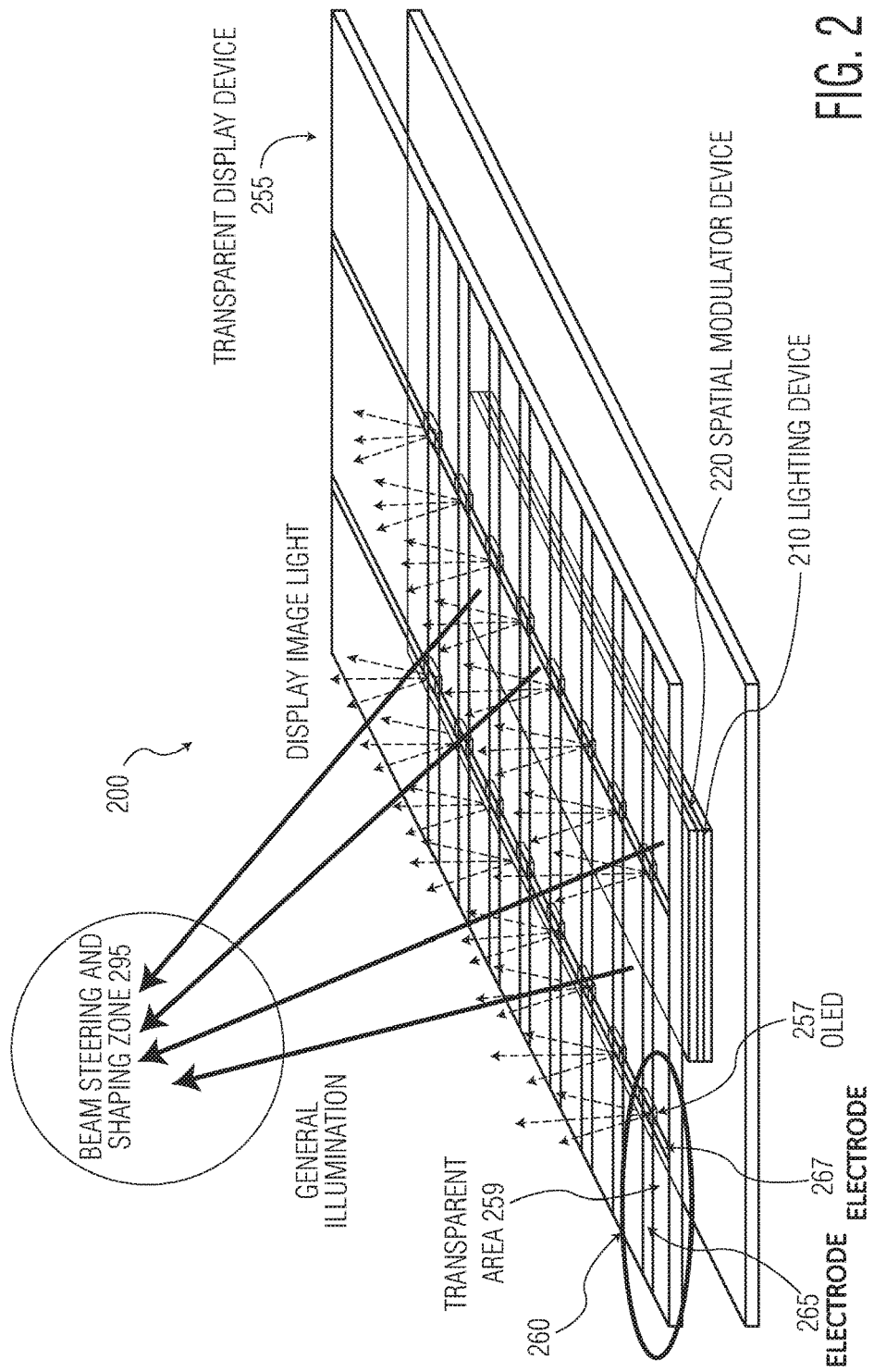
FIG. 2 is a high-level plan view of a luminaire, such as that of FIG. 1.

The configuration of an example of the controllable lighting system 111A and transparent display device 225 of FIG. 1 will now be described in more detail with reference to FIG. 2. FIG. 2 is a high-level plan view of a luminaire 200. The luminaire 200 includes a lighting device 210, a spatial modulator 220, and a transparent display device 255. In this example, the transparent display device 255 is an array of display pixels 260, each of which includes one or more OLED as shown at 257. Each of the display pixels 260 also includes a transparent area 259. The example of a panel of the transparent display device 255 also has electrodes 265 and 267, which may extend into the areas of the display pixels 260 for connection purposes. As shown the electrodes 265 and 267 extend in a row and column arrangement interconnecting the respective display pixels 260 in the display pixel array of the transparent display device 255. The electrodes 265 and 267 may be configured to implement either an active matrix (with additional pixel-level circuitry not shown in this example) or a passive matrix control methodology of the respective OLEDs 257. The OLED 257 generates image display light.

As discussed above with respect to FIG. 1, the lighting device 210 emits general illumination light that complies with governmental regulations and/or industry standards for the location of the luminaire 200. The spatial modulator device 220 includes, for example, controllable optics, such as 233 of FIG. 1 above, that provide beam shaping and/or steering functionality. As shown in FIG. 2, the general illumination light emitted by the lighting device 210 is processed by the spatial modulator device 220 to have a particular light distribution selected in accordance with configuration data. Although shown in FIG. 2 as being smaller in area than the transparent display device 255, the lighting device 210 may be as large as the transparent display or alternatively may be smaller than actually shown. In the illustrated example, the processed general illumination light (shown as the heavier bold lines in FIG. 2) is directed to the beam steering and shaping zone 295.

The transparent display device 255 is optically coupled to the output of the spatial modulator device 220 and is configured to allow a substantial portion of the general illumination light processed by the spatial modulator device 220 to pass through substantially unobstructed. The transparent display device 255, like device 225 of FIG. 1, includes an array of display pixels 260. As noted/shown, each of the display pixels 260 in the array includes one or more OLEDs 257, a transparent area 259, and portions of the electrodes 265 and 267. The electrodes 265 and 267 deliver control signals from a driver, such as driver 113A of FIG. 1, to the respective OLEDs 257. The transparent area 259 also includes transparent parts of electrodes 265 and 267 and allows general illumination light generated by the lighting device 210 to pass through the transparent display device 255 toward the beam steering and shaping zone 295 substantially unobstructed. The electrodes 265 and 267, which will be described in more detail in other examples, are configured to be fabricated from a substantially transparent material, a translucent material or are formed on components (e.g. wires of a mesh) so small or thin that they are nearly transparent, and as such permit some amount of the processed general illumination light to pass through the electrodes 265 and 267. The OLEDs 257 also may allow some of the general illumination light generated by the lighting device 210 that passes through the OLEDs 257.

As shown by the dashed lines coming out of the respective OLEDs 257, the image display light emitted by the OLEDs 257 is directed out of the transparent display device 255. Although not shown, the luminaire 200 may also include a diffuser or other optics that are positioned at the output of the transparent display device. An example of the layout of an array of display pixels of a transparent display device, such as 255, will be described in more detail with reference to FIG. 3.

As used herein, a display pixel 345 combination of the area filled by the OLED 375 and the transparent area 379, and refers to an OLED or a combination of two or more OLEDs that emit light, including OLEDs in a stacked arrangement or in combination of stacked and unstacked OLED structures. The transparent region or transparent area 379 allows light to pass through substantially unobstructed. The array 300 that makes up a transparent display panel refers to the array of display pixels 345.

The OLEDs 375 of the array 300 are activated to generate image light to form an image that is output from the transparent display panel. For example, each of the OLED stacks 375 may be controlled as to color and intensity so as to produce light for a corresponding pixel of an image that is presented by the transparent display device. When referring to the image generated by the transparent display panel, an image pixel is the intended output of a corresponding display pixel 345.

Figure 3:
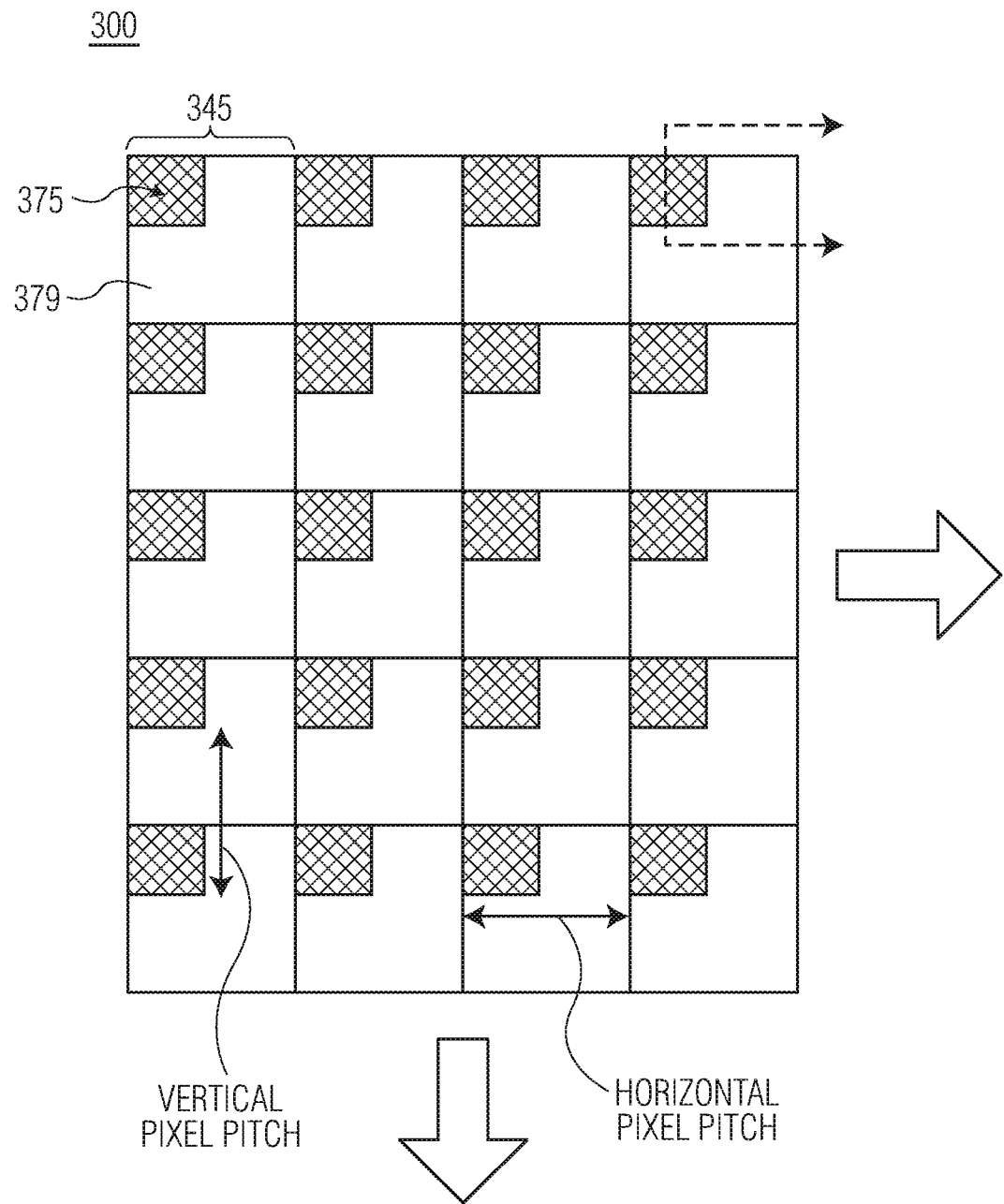
FIG. 3 is a high-level, top-view example of a portion of a transparent display utilizing stacked OLEDs.

FIG. 3 is a high-level, top-view example of a portion of a transparent display utilizing stacked OLEDs. Examples of OLED stacks are discussed in more detail with regard to later drawings. In the view of FIG. 3 (as if looking into an array from a position to observe an emitted image) only the outline of the stack of OLEDs of each pixel is visible. The underlying driver electronics and control features of a typical display device are explained in more detail with reference to the example of FIG. 11. In the example of FIG. 3, a transparent display device is made up of an array 300 of display pixels (i.e., pixels 345. Each display pixel 345 of the display pixel array 300 includes a number of separately controllable OLEDs 375 in a stack, and a transparent region, or area, 379 in-between the stacked OLEDs 375 of the array of display pixels 300. Each of the OLEDs 375 is, in some examples, three separately controllable OLEDs each constructed to emit visible light of a different one of three colors, such as red, green and blue, white, blue, yellow, or other combinations of colors. The three separately controllable OLEDs may be stacked one upon the other to create a stack of OLEDs that output a combination of red, green and blue light. Stacking of the OLEDs is beneficial because the stack of OLEDs 375 reduces the area occupied by the light emitting elements OLEDs 375 within the respective display pixels 345 thereby increasing the optical transmissivity of the transparent display.

As mentioned above with regard to this example, each display pixel 345 includes a stacked OLED 375 and a transparent region 379 in-between the stacked OLEDs 375 of other display pixels 345 in the array 300. The physical sizes of the respective stacked OLED 375 and the transparent regions 379 contribute to the pixel pitch, which may be measured in the horizontal and vertical dimensions. As shown in the example of FIG. 3, the vertical and horizontal pixel pitches are measured from a first side of an OLED 375 to a corresponding first side of another OLED in an immediately neighboring display pixel 345. Since the display pixels 345 of FIG. 3 are shown as squares, the vertical and horizontal pixel pitches are equal; however, in cases in which the display pixels 345 are different shapes, such as rectangles or ovals, the vertical and horizontal pixel pitches may differ.

The transparent areas 379 are formed from a transparent material, such as clear areas of glass or other synthetic material having optical properties similar or superior to glass, that may be used as the substrate of the array. The transparent areas 379 may not be uniformly transparent as some portions of the respective transparent areas 379 may have reduced transmissivity due to the presence of electrodes (not shown in this example) and/or circuitry (not shown in this example). In the example, the transparent area 379 of each display pixel 345 encompasses a greater area than the OLED 375. For example, a ratio of the percentage of display pixel 345 area occupied by the OLED stack 375 to percentage of display pixel 345 area occupied by the transparent portion 379 is less than or equal to 80%:20%. While the OLED stack 375 is shown positioned in a corner of the display pixel 345, the OLED stack may be located at other locations, such as the center, another corner, off-set from center, offset from a corner or side (see for example, display pixel 240 of FIG. 1), within the display pixel 345 so long as the ratio of area occupied by the OLED stack 375 to transparent area 379 remains at approximately 20% to 80%.

It is envisioned that the percentage of display pixel 345 area occupied by the OLED stack 37 will continue to diminish as the performance of OLED devices improves. It is foreseeable that the ratio of the percentage of display pixel 345 area occupied by the OLED stack 375 to percentage of display pixel 345 area occupied by the transparent portion 379 will achieve ratios of 40%:60%, 30%:70, 20%:80% and even 5%:95% using OLED stacking techniques, vacuum evaporation/sublimation small-molecule OLED techniques, improved conductor technology, such as silver nanowire conductors, and additional coating techniques such as Argon coating.

By stacking the OLEDs 375 one upon the other, instead of placing them beside one another laterally across the display pixel 345, the light emitting parts of the transparent display consume less area of the display pixel 345. As a result of the stacked OLED 375 taking up less area of the display pixel 345, the transparent area 379 may have a larger area thereby increasing the transmissivity of not only the respective display pixels 345, but the entire display array 300, and hence the transmissivity of the entire transparent display device is increased. A benefit of the increased transmissivity of the display array 300, is that a greater amount of general illumination light provided by a lighting device, such as 221 of FIG. 1, can pass through the transparent display; although this increase in transmissivity and transparency may serve to improve other applications of the display device.

In an example in which the OLED stacks 375 emit three colors of light, the OLED stacks 375 and transparent regions 379 of the display pixels 345 are structured so that the transparent display panel device exhibits an overall optical transmissivity with respect to at least the three colors of light of 50% or more. In other examples, the pixels 375 and transparent regions 379 are structured so that the transparent display device exhibits an overall optical transmissivity with respect to at least the three colors of light of 60% or more. In further examples, the pixels 375 and transparent regions 379 are structured so that the transparent display panel exhibits an overall optical transmissivity with respect to at least the three colors of light of 70% or more. As described with respect to later examples, the pixels 375 and transparent regions 379 are structured so that the transparent display device exhibits an overall optical transmissivity with respect to at least the three colors of light of 80% or more, and even approximately 85% or more. The approximately 85% or more may be equal to approximately 85%±5%. Of course, these improved levels of transmissivity may apply to other colors, frequencies or wavelengths of light in or near the visible light spectrum. These varied percentages of overall optical transmissivity may be achieved through the use of various OLED techniques, electrode design and materials and the like as described in more detail with reference to the following examples.

It may be appropriate now to discuss the enhanced OLED techniques that enable the increased transmissivity of the transparent display device.

Figure 4A:
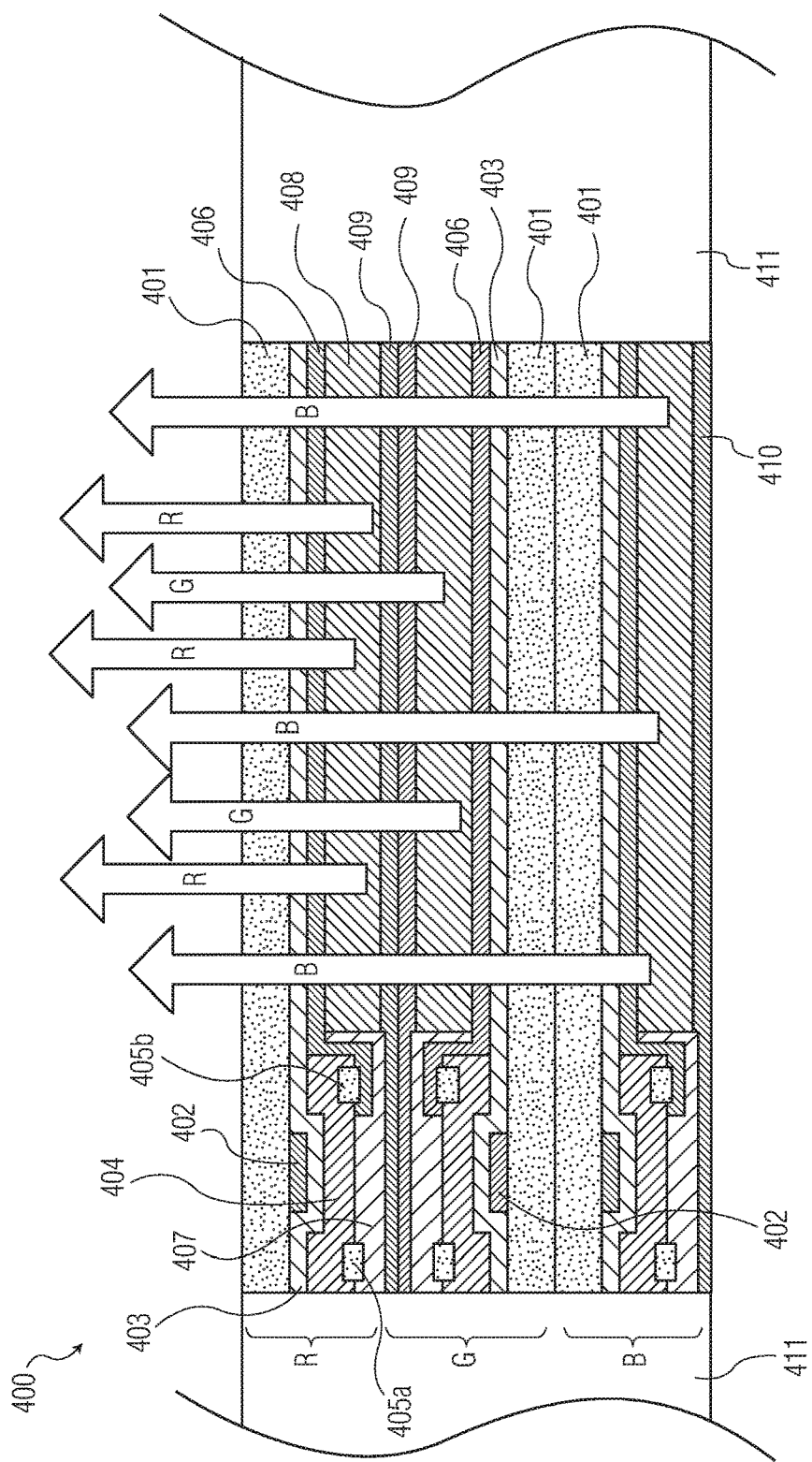
FIG. 4A illustrates a cross-section of an example of a stacked, active matrix controllable, OLED usable in an example of a transparent display panel.

FIG. 4A illustrates a cross-section of an example of a stacked, active matrix controllable, OLED usable in an example of a transparent display panel, such as that of FIGS. 1-3. In this example, the OLED stack 400 for the display pixel is part of an active matrix.

A technique for reducing the area of the display pixel attributable to the light emitting devices is to take advantage of the transparent properties of OLEDs by stacking the different colored OLEDs on top of one another. Active matrix (AM) OLEDs include transistors, interconnections and capacitors to switch the OLEDs ON and OFF. The transistors, interconnections and capacitors used in an AMOLED are opaque, which reduces the transmissivity of a transparent display panel that utilizes active matrix control. The transistor circuits may include two or more transistors and one or more capacitive circuits. For example, some implementations include two transistors and a single capacitor, or even four transistors and two capacitors, both of which enable faster ON/OFF switching. A method for increasing the transmissivity of a pixel of an AMOLED display, by stacking OLEDs of the pixel, is illustrated in FIG. 4A.

In the example of FIG. 4A, the R (red), G (green) and B (blue) OLEDs are stacked one upon the other and are configured to emit light. OLEDs are somewhat transparent, although not as highly transmissive as other clear materials such as glass. Hence the OLEDs in the stack also are configured to permit light, such as light (e.g. arrows labeled B) emitted by OLEDs (e.g. B and G) at the lower levels of the stack to pass light out of the OLED stack 400 for emission into the area in which the luminaire is located. Stacking the R, G and B OLEDs reduces the less transmissive area occupied by the display pixel and thereby increases the area that may be transparent. The transmissivity of a transparent display panel may further be enhanced through use of transparent oxide materials, and by orienting individual OLEDs in the OLED stack to position the opaque transistor and interconnections over one another in the stack to reduce the area covered by the opaque transistors and interconnections of the stacked OLEDs as will be described in more detail below.

For example, a first of the OLEDs, in this case OLED R, is stacked on a light emitting surface 409 of the second of the OLEDs, in this case OLED G. OLED G, the second of the OLEDs, is stacked on a light emitting surface of the third of the OLEDs, in this case OLED B.

As shown the light represented by arrows labeled B from the emitting surface of the third OLED (i.e., OLED B) passes through the second, OLED G, and through the first, OLED R. Similarly, light represented by arrows labeled G) from the emitting surface of the OLED G passes through the OLED R. The light emerging from an emitting surface of the OLED R includes light emitted by the OLED R itself (represented by arrows labeled R) as well as light emitted by the second (i.e. G) and third (i.e. B) OLEDs. For ease of illustration the light represented by arrows RGB are shown emitting in one direction, it should be understood that the light may emit in multiple directions.

In more detail, the transistor circuits for each of the respective R, G and B OLEDs are similar, and an example is described specifically with respect to the transistor circuit associated with the R OLED. The example of the transistor circuit includes a gate electrode 402, a dielectric layer 403, semiconductor transistor material 404, a source electrode 405a, and a drain electrode 405b. The interconnections for each of respective transistor circuits for R, G and B OLEDs includes an anode 406 and a cathode 409. The stack of OLEDs R, G and B may be covered on an output end by a transparent substrate 401, which may be formed from glass, a highly transmissive plastic, etc., and opposite the transparent substrate 401 may be an encapsulation layer 410, which may or may not be reflective. In the example, the OLED stack is configured to emit intended display light through the transparent substrate 401. The OLED stacking technique, however, may be utilized in a pixel structure may be configured to emit intended display light through the encapsulation layer 410 instead of through the transparent substrate 401.

In order to increase the transparent area 411 in between the stacked OLEDs R, G and B, the area covered by the transistor circuits and interconnections of each of the respective OLEDs R, G and B in the OLED stack are positioned over other transistor circuits and interconnections of another OLED (e.g., R over G, and both over B) in the OLED stack. For example, the transparent area 411 for stacked AMOLED 400 may be formed from a transparent substrate. However, from a practical fabrication process and mechanical support standpoint, the space in between transparent substrates is usually filled by deposition of transparent material, e.g. silicon dioxide or silicon nitride. This, for example, may help with planarization so that each display pixel on an overall display panel is closely contacted.

Although not shown in detail, each of the OLEDs R, G and B of the OLED stack 400 includes an organic layer 408 that is activated by the signals from transistors applied to the anode 406 and cathode 409 of the respective OLEDs R, G and B. While not shown in detail, the organic layer 408 is formed from several internal layers such as an electron injection layer (EIL), an electron transport layer (ETL), an emissive layer (EL), a hole transport layer (HTL), and a hole injection layer (HIL). The different colors of OLEDs may have different compositions of materials for each of the respective internal layers. Regardless of the color of the OLED, the combination of layers, EIL, ETL, EL, HTL, and HIL, are referred to collectively as the organic layer 408.

The respective R, G and B OLEDs also include an electrical connection for applying a voltage across the first OLED, second OLED, and third OLED in the stack. Alternatively, the electrical connection delivers a current that is sufficient to excite the OLED.

Turning to the arrangement of the AMOLED arrangement shown in FIG. 4A, each respective display pixel in an array of display pixels includes transistor circuits, such as 402-404, 405a and 405b to activate the respective OLEDs in the respective display pixel. In addition to the transistor circuits 402-404, 405a and 405b, interconnections between the transistor circuits are used to configure the array as an active matrix OLED array of display pixels.

Element 411 of FIG. 4A represents a region of transparent material, such as 379 of FIG. 3, that is in-between the stacked OLEDs R, G, B of the respective display pixel and stacked OLEDs (not shown in this example) of an adjacent display pixel. The transparent region 411 usually includes glass and/or encapsulation with light transmissivity greater than 80%. By reducing the area consumed by the OLED and the related circuitry, larger transparent areas may be incorporated into the transparent display, such as 255, which leads to higher overall transparency as well as reducing the usage of OLED and transparent conductor material by placing the OLEDs in closer proximity to one another. For example, active matrix control implemented using two transistors and one capacitive circuit provides increased transmissivity and reduced costs as compared to the four transistor and two capacitive circuit active matrix control, which provides higher performance but at a higher cost and reduced transmissivity.

Figure 4B:
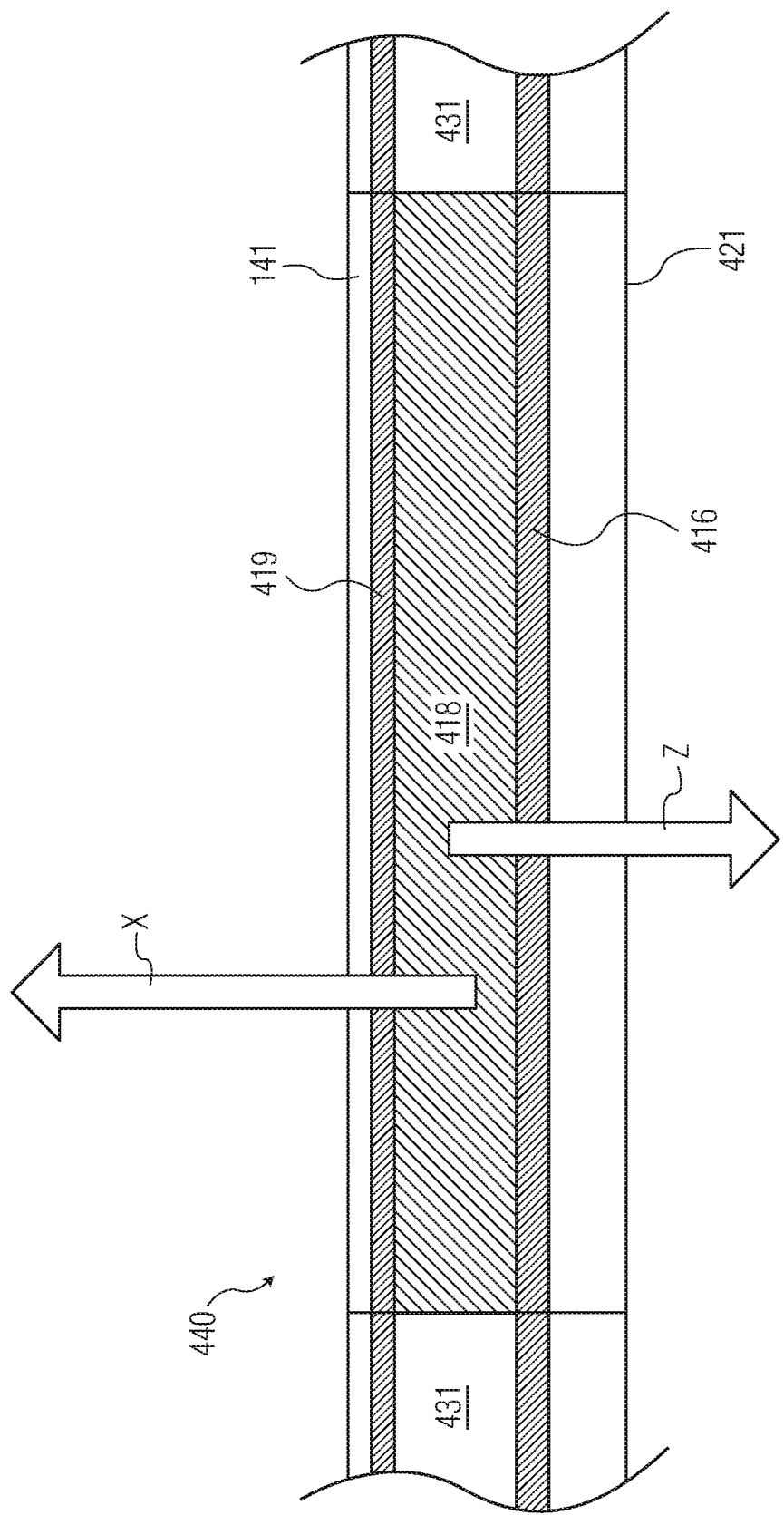
FIG. 4B illustrates a cross-section of another example of a passive matrix controllable, OLED usable in an example of a transparent display panel.

Another type of OLED usable in a transparent display panel as discussed herein is a passive matrix (PM) OLED. FIG. 4B illustrates a cross-section of another example of a single, passive matrix controllable, OLED usable in an example of a stacked PMOLED implementation of a transparent display panel. A single PMOLED is presented for ease of discussion and illustration.

The PMOLED 440 is usable as an emitter of a display pixel in a passive matrix-controlled transparent display. The PMOLED 440 has an active region 418 that emits light shown as light rays X and Z in response to current or voltage signals applied to electrodes 419 (i.e. cathode) and 416 (i.e. anode). The electrode 416 is disposed on a transparent substrate 421. The active region 418 is disposed on the electrode 416. The transparent substrate 421 may be made from glass, plastic or some other transparent material. The side opposite the transparent substrate 421 is covered with an encapsulation layer 141. The encapsulation layer 141 is also formed from a transparent material, such as glass, plastic or some other transparent material. Beside the PMOLED 440 are transparent regions 431. Additional examples of PMOLEDs will be described with reference to FIGS. 8A-10.

Although the OLED 400 is shown as a single stack of AMOLEDs (FIG. 4A) it is also envisioned that the OLEDs may be placed beside one another in a common plane as an unstacked structure including transparent regions that form a display pixel in a transparent display panel. The single PMOLED of FIG. 4B is shown for ease of discussion but it is envisioned that the described OLED examples may be implemented using a number of PMOLEDs in a stacked orientation.

In some examples, the transparent display may be configured for either active matrix control or passive matrix control depending upon the pixel density of the transparent display panel.

As discussed above, one technique for increasing the transmissivity of a transparent display panel is to increase the area of the transparent regions by reducing the area of the array units that are consumed by the OLEDs and any associated opaque or low transmissivity components. The electrodes of the OLEDs are components that are not only associated with the respective OLEDs but also are associated with the transparent regions. In order to interconnect the respective OLEDs in the array of display pixels, the electrodes must traverse the transparent regions. The materials used to construct the electrodes may be mildly opaque, or near transparent, e.g. indium-tin-oxide (ITO) or the like. Current materials typically used for the electrodes still absorb (i.e. trap), refract and/or reflect some of the light that is passing through a transparent region. In order to further increase the transmissivity of a transparent display panel, a way to limit the adverse impact of the electrodes on light passing through the display panel will be described with reference to FIGS. 5A and 5B.

Figure 5A:
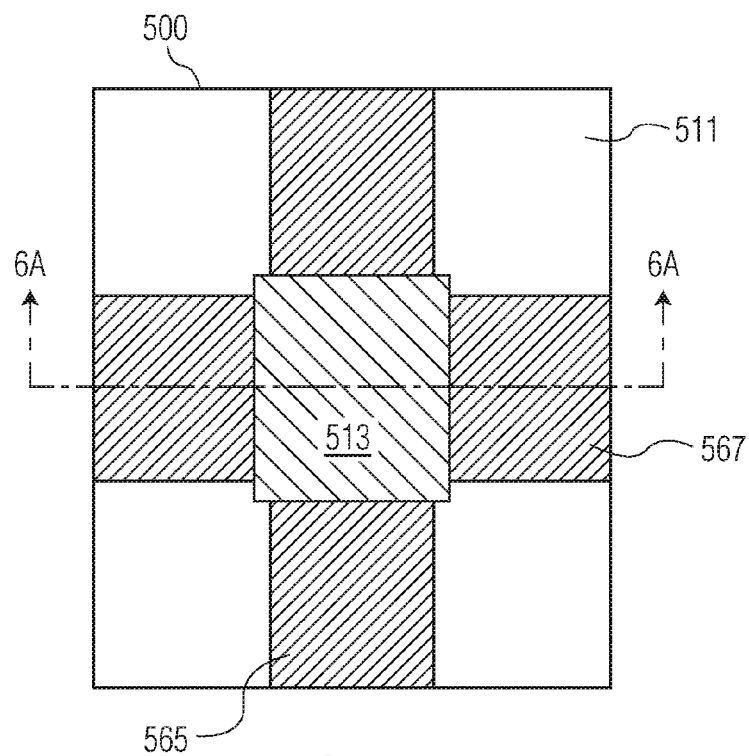
FIG. 5A illustrates a top-view diagram of display pixel incorporating a stacked, passive matrix (PM) OLED usable in an example of a transparent display panel.

FIG. 5A illustrates a top-view diagram of an array display pixels incorporating a stack of OLEDs, for a passive matrix (PM) OLED-type transparent display panel. At a high-level, the array of display pixels 500 of FIG. 5A includes an OLED stack 513, transparent regions 511, and electrodes 565 and 567. In this example, each electrode 565 and 567 in a matrix of electrodes has a width that is substantially equivalent to or less than a width of a light emitting region of each respective OLED stack 513. The electrode 565 may be a first electrode that is coupled to a first side of the OLED stack 513. The electrode 567 may be a second electrode that is coupled to a second side of the OLED stack 513. The electrodes 565 and 567 may be connected to PMOLED array type driver, such as may be included in driver system 113A of FIG. 1 or used to implement video driver system 1113 of FIG. 11. The PMOLED array type driver applies control signals to the respective electrodes to selectively activate the OLEDs of the pixel, in this case, the OLEDs of the stack 513.

As shown, the electrodes 565 and 567 consume nearly 50% of the area of the array of display pixel 500. The materials used to construct the electrodes may be mildly opaque, or near transparent, e.g. indium-tin-oxide (ITO) or the like.

Further transmissivity improvement, over that possible with the use of typical transparent electrode materials like ITO, may be desirable. The electrodes 565 and 567 have specific dimensions so that the current density of the current passing through the respective electrodes 565 and 567 is evenly distributed within the active regions of OLED stack 513. Therefore, simply reducing the size of electrodes to increase the area of transparent region 511 is not a viable solution to increase transparency of the display. However, the materials from which the electrodes 565 and 567 are made may enable greater electrode transparency thereby resulting in greater transmissivity of the display pixel 500. For example, electrodes fabricated using silver nanowires provide high conductivity and increased transmissivity as compared to current "transparent' electrodes such as indium-tin-oxide (ITO). Silver nanowire mesh (or a silver nanowire percolation network) can provide higher transmissivity and higher conductivity than broadly used ITO.

Figure 5B:
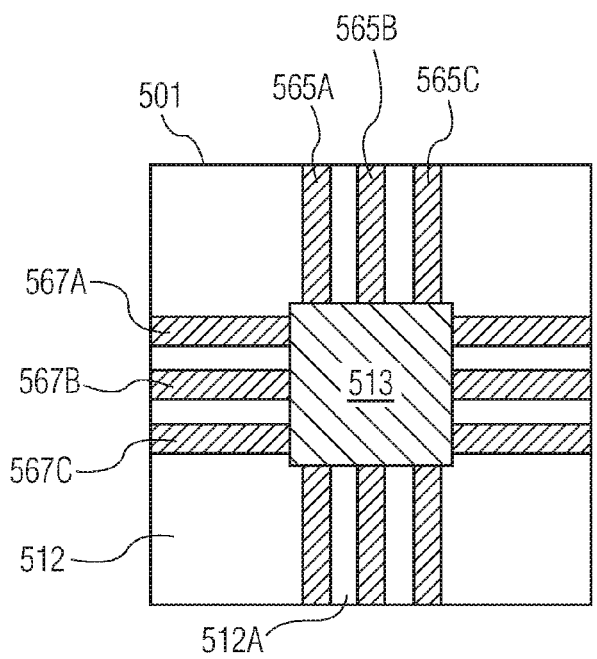
FIG. 5B illustrates a top-view diagram of a display pixel incorporating an alternate electrode configuration.

FIG. 5B illustrates a top-view diagram of an display pixel incorporating an alternate electrode configuration. In addition to utilizing different materials, as mentioned with respect to FIG. 5A, to fabricate electrodes, the number of electrodes supplying an display pixel, such as 501, may be increased so that each electrode in the matrix of electrodes coupled to each respective OLED includes a number of electrodes, such as 565A-C and 567A-C, coupled to a side of a light emitting region of each respective OLED stack 513. So while the width of each of the number of electrodes is less than a dimension of the side of the light emitting region of each respective OLED to which the number of electrodes is coupled, the number of electrodes facilitates even distribution of electrical current to the light emitting region of each respective OLED stack 513. As a result of increasing the number of electrodes and reducing the size of the electrodes, the area of transparent region of the display pixel not only includes transparent regions 511 but also includes area 512 between each of the number of electrodes 565A-C and 567A-C. The structure of the OLED stack 513 of FIG. 5A will be described in more detail with reference to FIGS. 6A and 6B, which describe variations of the OLED 513 taken at the cross-section AA-AA.

Figure 6A:
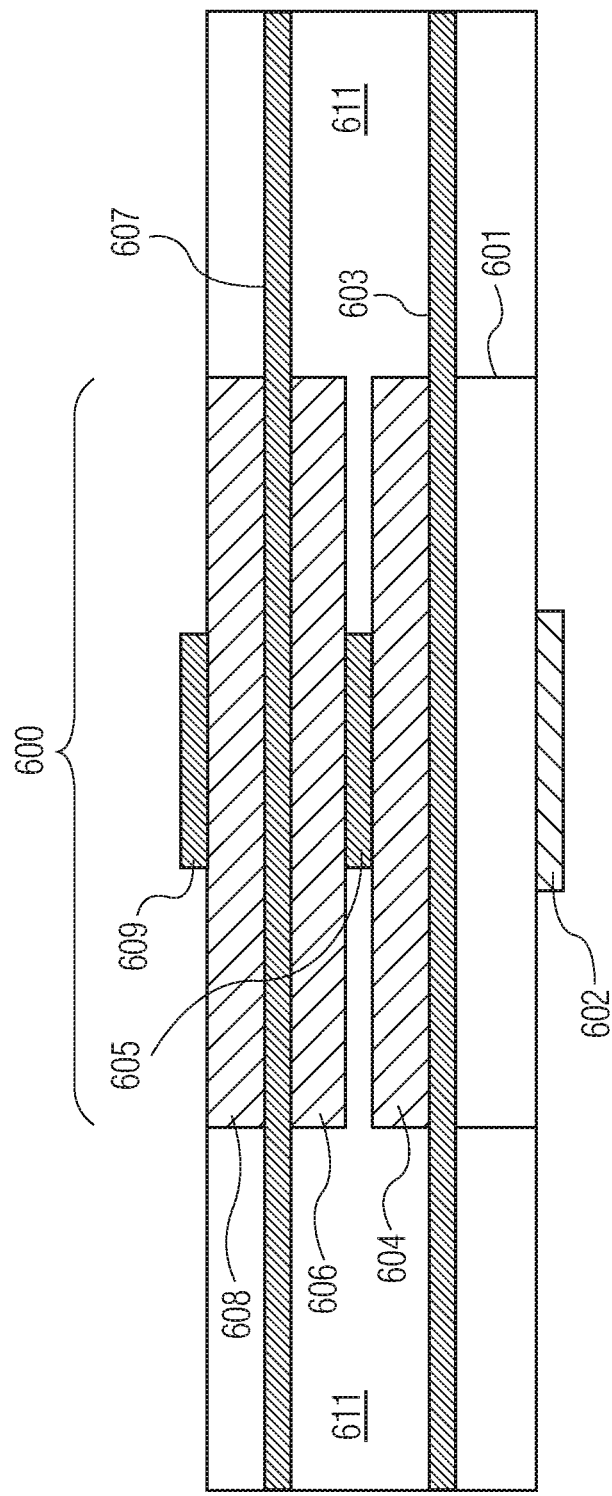
FIG. 6A illustrates a cross-sectional view of an example of a stacked PMOLED of FIG. 5A or 5B.

FIG. 6A illustrates a cross-sectional view of an OLED stack 600 and neighboring transparent areas 611, for a passive matrix controllable PMOLED display. For example, the OLED and electrodes of the example of FIG. 5A or of the example of FIG. 5B may be used as part of the stack in FIG. 6A.

The OLED stack 600 may include a first OLED 604 for emitting a first color (e.g. blue), a second OLED 606 for emitting a second color (e.g. green), and a third OLED 608 coupled for emitting third color (e.g. red) in a stacked orientation. In addition, the OLED stack 600 also includes a number electrodes, such as 603, 605, 607 and 609, interconnecting each OLED in the OLED stack of each respective display pixels in the array to form a passive matrix array coupled to an appropriate PMOLED type display driver. Although conventional transparent electrode materials may be used, the e respective electrodes 603, 605, 607 and 609 may be fabricated with conductors made using silver nanowire or other small-scale conductive materials, such as graphene or the like. A passive matrix array differs from an active matrix array as described with reference to FIG. 4A in that a passive matrix does not require the transistor circuitry and corresponding interconnections. As shown in FIG. 6A and described below, the OLEDs, 604, 606 and 608 in the OLED stack 600 are coupled via a matrix of electrodes 603, 605, 607 and 609, to other OLEDs in an array. The electrodes 603, 605, 607 and 609 are connected, respectively, to opposing sides of each OLED in the OLED stack 600 to facilitate activation of the respective OLEDs 604, 606 and/or 608.

With regard to the OLED stack 600, the OLED stack 600 may be formed on a substrate 601, which may be glass or plastic. For discussion and illustration purposes only, the drawing shows an orientation in which display light is intended for emission from the stack in a direction toward the top of the drawing. The OLEDs may generate some light in the opposite direction, but such light would be lost and not contribute to the display function. Hence, a reflector 602 may be positioned on a side of the substrate 601. The reflector 602 may be any form of reflective surface or device, such as one-way retro-reflector optic, such as a corner cube optic such as found in bicycle or automotive reflectors, or the like. On a side of the substrate 601 opposite the reflector 601 is a first electrode 603, which may be a row electrode of the PMOLED matrix, that couples to a side of an active region of a first colored OLED 604. The opposite side of the first-colored OLED 604 active region is coupled to a second electrode 605, which may be a column electrode of the PMOLED matrix. The second electrode 605 is also coupled to an active region of the second-colored OLED 606. The opposite side of the second-colored OLED 606 active region is coupled to a third electrode 607, which may be another row electrode. The third electrode 607 is also coupled to an active region of the third-colored OLED 608. The opposite side of the third-colored OLED 608 active region is coupled to a fourth electrode 609, which may be a column electrode. On either side of the OLED stack 600 are transparent regions 611 that (as shown in other examples, such as FIG. 7) are in-between OLEDs of the array of a transparent display panel.

Figure 6B:
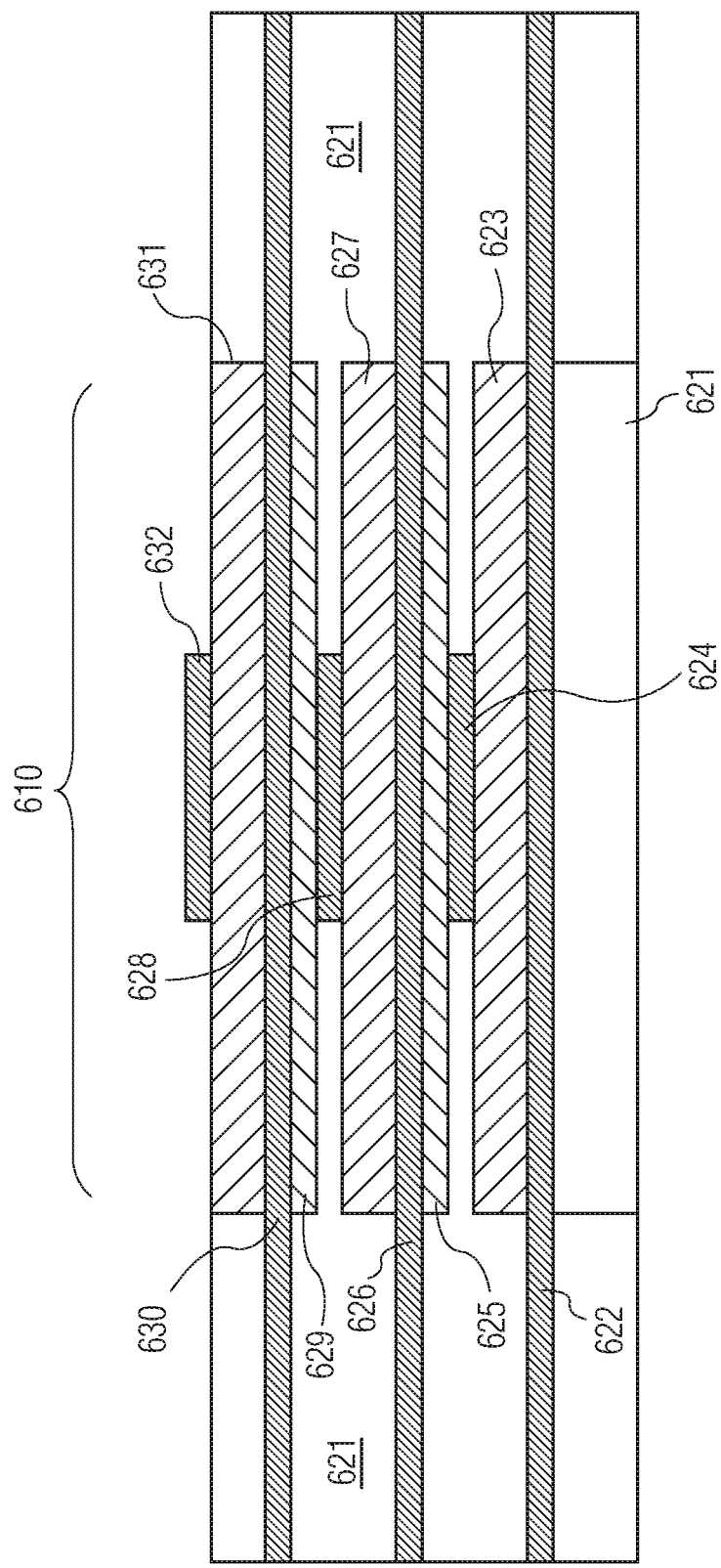
FIG. 6B illustrates a cross-sectional view of an alternate example of a stacked PMOLED of FIG. 5A or 5B.

FIG. 6B illustrates a cross-sectional view of another example of an OLED stack and neighboring transparent areas, for a passive matrix controllable PMOLED display. For example, the OLED and electrodes of the example of FIG. 5A or of the example of FIG. 5B may be used as part of the stack in FIG. 6B. As previously mentioned an OLED stack corresponds to a display pixel, such as 375 of FIG. 3, of an array. For discussion and illustration purposes only, the drawing shows an orientation in which display light is intended for emission from the stack in a direction toward the top of the drawing.

Similar to the OLED stack structure of FIG. 6A, the OLED stack 610 includes three separately controllable OLEDs, such as 623, 627 and 631, each of which is constructed to emit visible light of a different respective one of three colors. Also shown are transparent regions 621 of the panel in-between OLEDs of the array. As shown in FIG. 6B and described below, the OLEDs, 623, 627 and 631 in the OLED stack 610 are coupled via a matrix of electrodes 622, 624, 626, 628, 630 and 632 that are connected to opposing sides of each OLED in the OLED stack 610 to facilitate activation of the respective OLEDs 623, 627 and/or 631. Although conventional transparent electrode materials may be used, the respective electrodes 622, 624, 626, 628, 630 and 632 may be fabricated with conductors made using silver nanowire mesh, silver nanowire percolate network, or other small-scale conductive materials, such as graphene or the like.

The OLED stack 610 of FIG. 6B may be formed on a substrate 621. The substrate 621 may be made from glass or plastic. For discussion and illustration purposes only, the drawing shows an orientation in which display light is intended for emission from the stack in a direction toward the top of the drawing. The OLEDs may generate some light in the opposite direction, but such light would be lost and not contribute to the display function. On a side of the substrate 621 is a first electrode 622, which may be a row electrode of the PMOLED matrix, that couples to a side of an active region of a first colored OLED 623. The opposite side of the first-colored OLED 623 active region is coupled to a second electrode 624, which may be a column electrode of the PMOLED matrix. A transparent insulator 625 separates the first-colored OLED from a third electrode 626. The third electrode 626, which may be another row electrode, is coupled to an active region of the second-colored OLED 627. The opposite side of the second-colored OLED 627 active region is coupled to a fourth electrode 628, which may be another column electrode. The fourth electrode 628 is insulated from the third-colored OLED 631 by transparent insulator 629. Upon the transparent insulator 629 is a fifth electrode 630, which may be a row electrode, that is coupled to an active region of the third-colored OLED 631. The opposite side of the third-colored OLED 631 active region is coupled to a sixth electrode 632, which may be a column electrode. On either side of the OLED stack 610 are transparent regions 621 that (as shown in other examples, such as FIG. 7) are in-between OLEDs of the array of a transparent display panel.

Figure 7:
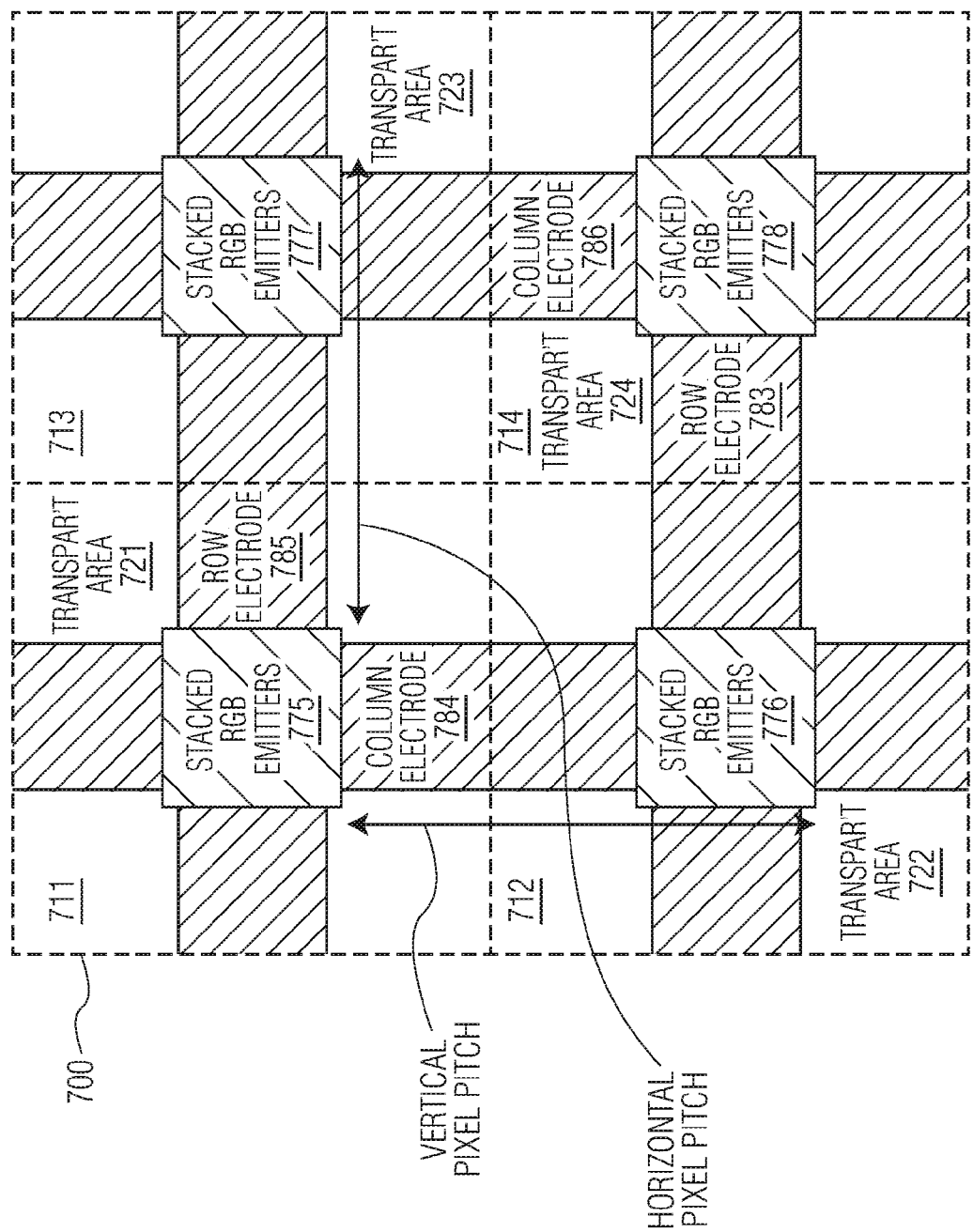
FIG. 7 illustrates a top view example of a portion of a transparent display panel utilizing multiple stacked, passive matrix-controllable OLEDs.

FIG. 7 illustrates a top view example of a portion of a transparent display panel utilizing multiple stacked, passive matrix-controllable OLEDs. The portion 700 of a transparent display panel shows display pixels 711-714. The display pixels 711-714 include respective stacked RGB emitters 775-778 formed on OLEDs. The display pixels 711-714 also include transparent areas 721-724. It should be noted that, in the illustrated example, the transparent areas 721-724 surround the respective stacked RGB emitter 775-778. Each stacked RGB emitter 775-778 in respective display pixels 711-714 is interconnected with a row electrode, such as row electrode 783 or 785 and column electrode 784 or 786 to form a passive matrix array. The interconnections of the respective OLEDs in the stacked RGB emitters 775-778 will described in more detail with reference to FIG. 8A and FIGS. 9A and 9B.

As mentioned above, the transparent area of a transparent display panel, and hence the overall optical transmissivity of the transparent display panel may be increased by reducing area consumed by obstructing circuitry and/or components and by using more transparent materials. In addition, the electrodes trap light emitted by the respective OLEDs thereby reducing the overall optical efficiency of the stacked OLEDs. Another technique for increasing transmissivity that also increases the optical efficiency of the OLED stack, is to reduce the number of components that contribute to the reduced transmissivity and optical efficiency. While individual electrodes may only occlude a minimal amount of light that would pass through a transparent display panel, particularly the transparent area of the display pixel, when utilized in the stacked OLED configuration examples described herein, the occluding effect may be cumulative thereby having a noticeable negative effect on the overall optical transmissivity of the transparent display panel. One technique for limiting the cumulative transmissivity limiting effects of the electrodes and reducing the amount of light trapping in the respective layers is to reduce the number of electrodes. As will be explained with reference to FIG. 8A, the PMOLED configuration provides an opportunity to implement a reduced electrode example.

Figure 8A:
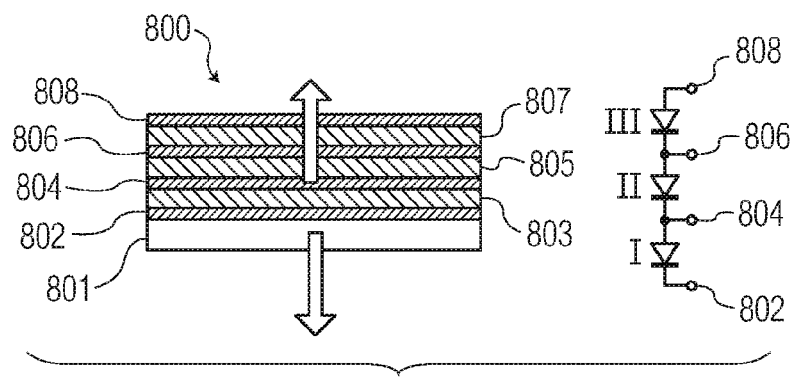
FIG. 8A illustrates an example of a display pixel using stacked OLEDs having a reduced number of electrodes, in passive matrix-controllable OLED display panel.

FIG. 8A illustrates an example of stacked, passive matrix-controllable OLED having a reduced number of electrodes. The stacked PMOLED 800 of FIG. 8A is a stacked light emitting device formed on a substrate 801. A first electrode 802, which may be a column or row electrode, respectively, is disposed on the substrate 801. A first PMOLED 803 that emits light of a first color is disposed over the substrate 801 and is electrically coupled to the first electrode 802. A second electrode 804 is disposed over the first PMOLED 803. The second electrode 804 is electrically coupled to the first PMOLED 803. The second electrode 804 may electrically coupled to a first side of an active region (not shown in this example) of the first PMOLED 803 A second PMOLED 805 is disposed over and is electrically coupled to the second electrode 804. For example, the electrode 804 also electrically couples to an active region of the second PMOLED 805 opposite to the connection of the second electrode 804. In this way, the second electrode 804 provides electrical connection to active regions of both OLEDs 803 and 805 of the stack. A third electrode 806 is disposed over and is electrically coupled to the second PMOLED 805. A third OLED 807 is disposed over and is electrically coupled to the third electrode 807 at an active region of the third OLED 807. Hence, the third electrode 806 provides electrical connections to both OLEDs 805 and 807. Disposed over the third OLED 807 is a fourth electrode 808 that is also electrically coupled to the third OLED 807. In some examples, the first, second, and third OLEDs, each emit light of one of three different colors. For example, the OLED 807 may emit red light, the OLED 805 may emit green light and the OLED 803 may emit blue light. The generated amounts of each output color are based on control signals. Alternatively, the respective OLEDs 803, 805 and 807 of OLED stack 800 may emit light of the same color, such as R, R, R, or different combinations, such as G, B and B.

Although not shown in detail, each of the OLEDs 803, 805 and 807 include additional components and structure such as anodes, cathodes and layers forming active regions that are coupled to the respective electrodes 802, 804, 806 and 808, similar to the respective layers shown in the example of FIG. 4B. As mentioned above, the number of electrodes in the PMOLED 800 is reduced compared to a stacked PMOLED such as that shown in FIG. 6B. The stacked OLED 800, instead of utilizing six (6) electrodes, uses four electrodes. As shown to the right of the stacked OLED 800 is a simple circuit diagram in which the respective OLEDs 803, 805, and 807 in the stacked OLED 800, are represented by diodes I, II and III, respectively. An example of the circuit operation will be described in more detail with reference to FIGS. 9A and 9B.

In addition to reducing the number of electrodes to increase overall transmissivity and improve the optical efficiency of the transparent display panel, the reduced number of electrodes may also incorporate materials as conductors, such as silver nanowires or the like, in the electrodes to further reduce the occluding caused by the number of electrodes. For example, electrodes 802, 804, 806 and 808 may be fabricated with transparent materials that incorporate a mesh of silver nanowires as conductors.

Figure 8B:
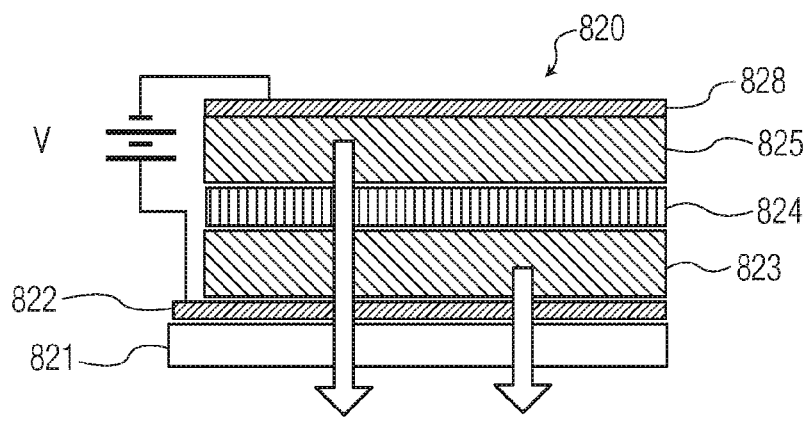
FIG. 8B illustrates a tandem OLED suitable for use in a stacked OLED structure such as that shown in FIG. 8A.

As mentioned above, the OLED stack 800 may be configured to emit light using a combination of OLEDs of the colors, Green, Blue and Blue. A method of forming a tandem OLED, such as a Blue-Blue, that uses a reduced number of electrodes is illustrated in FIG. 8B. FIG. 8B illustrates a tandem OLED suitable for use in a stacked OLED structure such as that shown in FIG. 8A. The tandem OLED 820 of FIG. 8B includes a transparent substrate 821, an anode 822, a first OLED 823, a charge generation layer 824, a second OLED 825 and a cathode 828. All of the respective elements 821-825 may be transparent to enable the light generated by the tandem OLED 820 to be output from the respective OLEDs 825, 823.

In response to a voltage applied by voltage source V across the anode 822 and cathode 828, each of the first OLED 823 and the second OLED 824 outputs light of the same color, such as blue. In an example in which the cathode 828 is reflective, and reflects light in the direction of the second OLED 825, substantially all the blue light generated by the second OLED 825 passes through the charge generation layer 824, the first OLED 823, the anode 822 and the transparent substrate 821, and is output in the direction of the arrows A benefit of this configuration is that the tandem OLED enables the brightness of the OLED stack to increase as the output light of a particular color is increased and also enables the number of electrodes to be reduced due to the use of the charge generation layer 824. The area of the stack on the substrate, however, may be comparable to the substrate area for a single OLED.

In a simplified description, the charge generation layer 824 contributes holes to the second OLED 825 which receives electrons from the cathode 828 to enable the second OLED 825 to produce light. Conversely, the charge generation layer 824 contributes electrons to the first OLED 823 which receives holes from the anode 822 to enable the first OLED 823 to produce light.

Figure 8C:
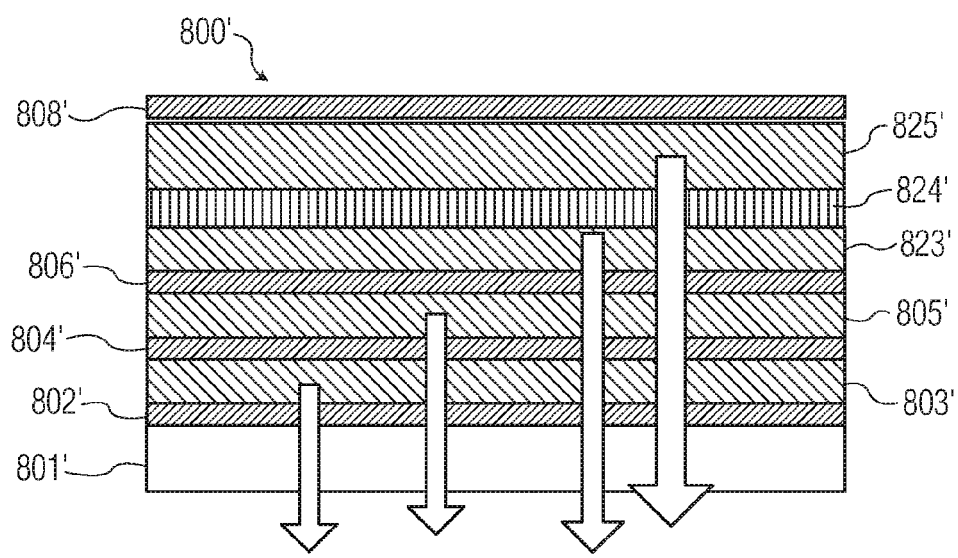
FIG. 8C illustrates a modified example of the OLED of FIG. 8A incorporating a tandem OLED, thereby forming a hybrid OLED.

The example of FIG. 8C illustrates a modification of the OLED 800 of FIG. 8A to incorporate a tandem OLED 820 of FIG. 8B, thereby forming a OLED 800'. In FIG. 8C, the third OLED 807 of FIG. 8A is replaced with the combination of the first OLED 823', the charge generation layer 824', the second OLED 825' to form a OLED stack having four OLEDs 803', 805', 823' and 825'. In which, the third OLED and the fourth OLEDs, in this case OLEDs 823' and 825' output light of the same color. The circuit connections I, II and III as shown in FIG. 8A remain the same even though an extra OLED 825' has been added in the OLED stack 800'. The added OLED 825' requires an increased voltage to be applied to account for the additional OLED in the OLED stack 800'.

Figure 8D:
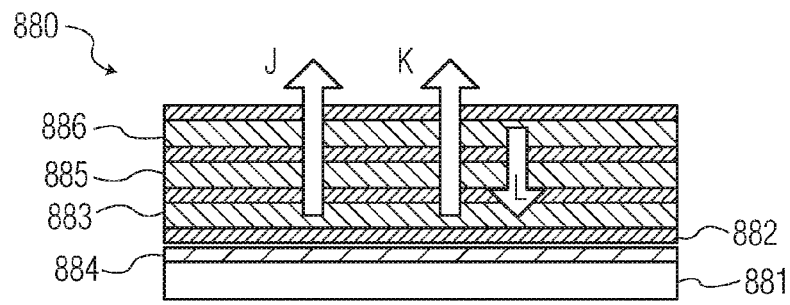
FIGS. 8D, 8E and 8F show cross-sectional views of other examples of stacked OLEDs, which incorporate reflective elements to increase the optical efficiency of the respective OLEDs, e.g. for use in a PMOLED used in a transparent display panel.
Figure 8E:
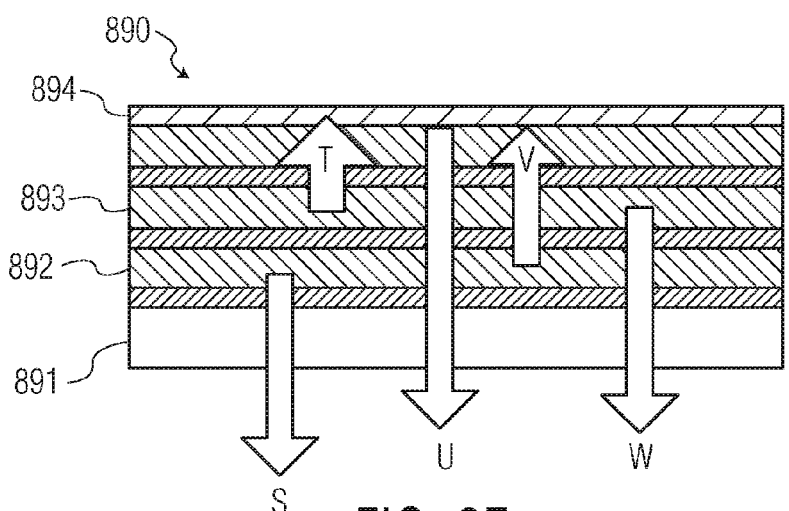
Figure 8F:
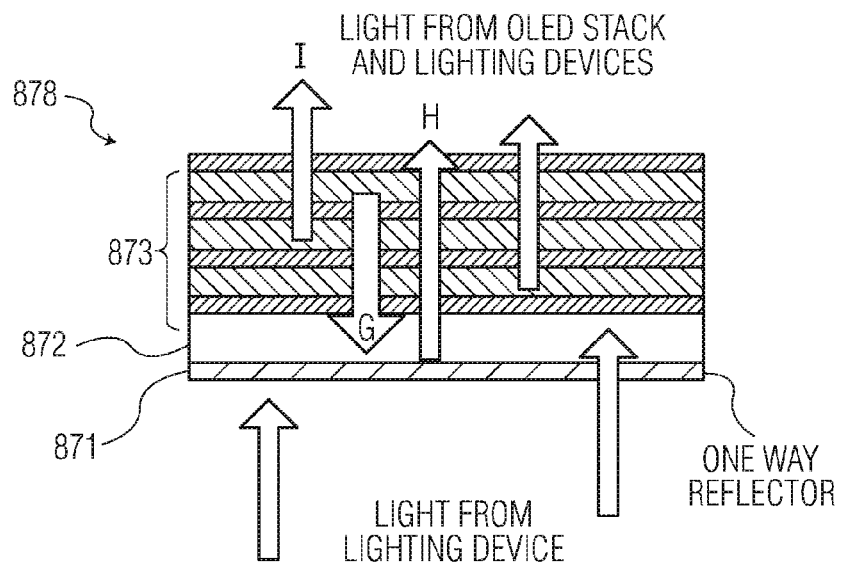

FIGS. 8D, 8E and 8F show cross-sectional views of other examples of stacked, passive matrix controllable OLEDs that incorporate reflective elements to increase the optical efficiency of the respective OLED stacks. The OLED stacks of FIGS. 8D-8F are substantially similar to the OLED stack described with reference to FIG. 8A, so therefore a detailed description of the respective layers will not be included for ease of description. As described herein, the individual OLEDs in the OLED stacks output light in all directions, but for ease of discussion and illustration the light emission is shown in two directions.

In FIG. 8D, the OLED stack 880 includes various electrodes and a number of OLEDs, such as 883, 885 and 886 that emit light, shown by the respective arrows J, K and L. The OLED stack 880 includes a reflective layer 884 disposed on a side of an electrode 882 opposite an OLED 882 and adjacent to the substrate 881 in the stack of OLEDs 880. As shown, light (arrow L) emitted by OLED 886 is emitted in the direction toward the substrate 881. The light (arrow L) is reflected by the reflective layer 884 and output through the other OLEDs, such as 883, 885 and 886, and electrodes, such as 882, of the OLED stack 880. Alternatively, the positions of reflective layer 884 and the electrodes 882 may be switched so that the reflective layer 884 is disposed on a side of the electrode 882. The reflective layer 884 may be a mirrored surface, a metallic surface or other material that reflects light emitted by the respective OLEDs, such as 883, 885 and 886, in the OLED stack 880. Although not shown, the OLED 886 also emits some light directly through the encapsulant as part of the intended output of stack 800. Also, the other OLEDs emit some light for reflection (e.g. downward) and some light more directly toward the output (e.g. upward). Alternatively, the electrode 882 and the reflective layer 884 may be replaced with a reflective electrode layer made from, for example, silver or aluminum, which possess both high optical reflectivity and electrical conductivity.

In another example as shown in FIG. 8E, a reflective layer 894 is positioned at an end of the OLED stack 890. The reflective layer 894 reflects light, such as arrow V and T, emitted by the respective OLEDs 892 and 893 out of the OLED stack 890 via a transparent substrate 891 which may generally be shown by arrows S, U and W. Arrow S may also represent light emitted by OLED 892. The reflective layer 894 may be a mirrored surface, a metallic surface or other material that reflects light emitted by the respective OLEDs, such as 892 and 893, in the OLED stack 890.

In the example of FIG. 8F, the OLED stack 878 includes OLEDs and electrodes in a stacked orientation, that is collectively referred to by reference numeral 873. The stack 878 also includes a substrate 872 and a one-way reflector 871. The OLEDs 873 are stacked upon substrate 872, and over the one-way reflector 871. The one-way reflector 871 is a material, such as a film, or a one-way retro-reflective optic, such as a corner-cube optic used in an automobile reflector, that permits light from outside the display (e.g. from a lighting device such as 221 of FIG. 1). The reflector 871, however, reflects light emitted by the OLEDs 873, such as, for example, light represented by arrow G, that may contribute to the output light shown by arrows H and I.

Figure 9A:
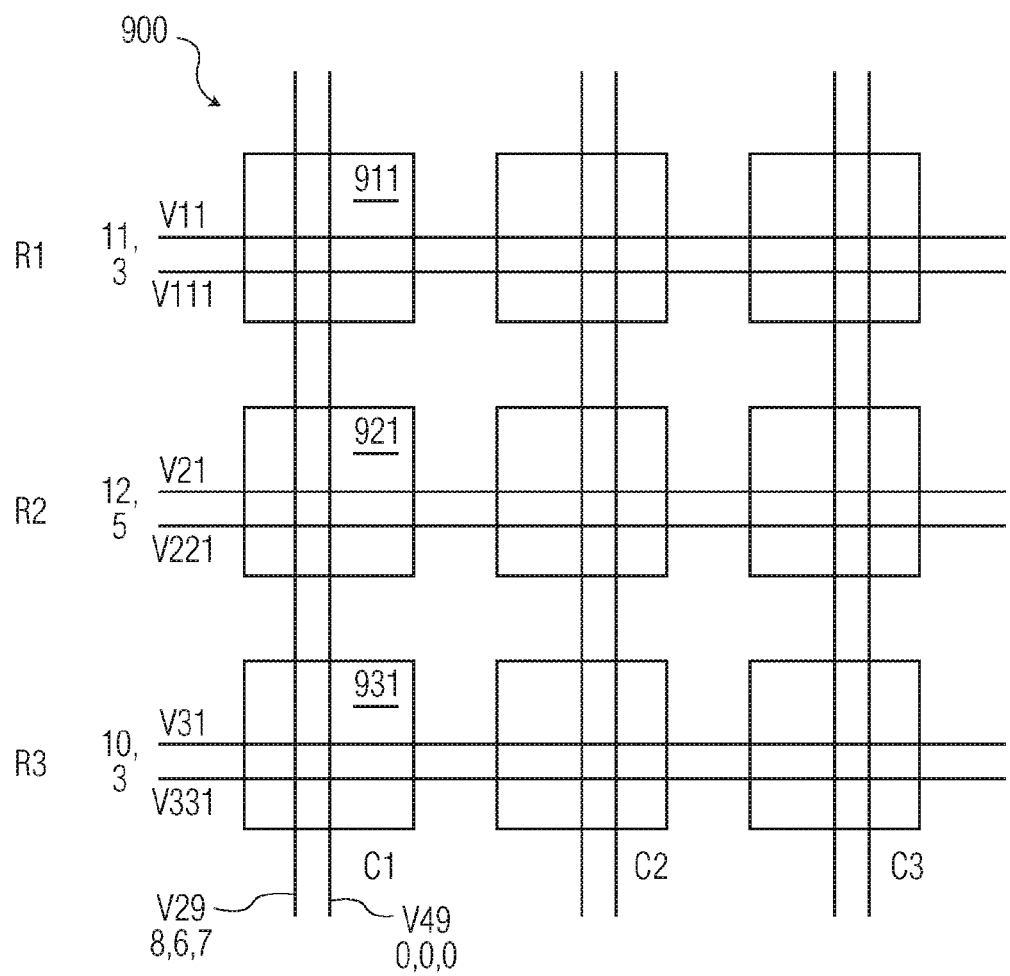
FIGS. 9A and 9B illustrate a simple example for controlling stacked OLEDs, in a passive matrix controllable OLED display.
Figure 9B:
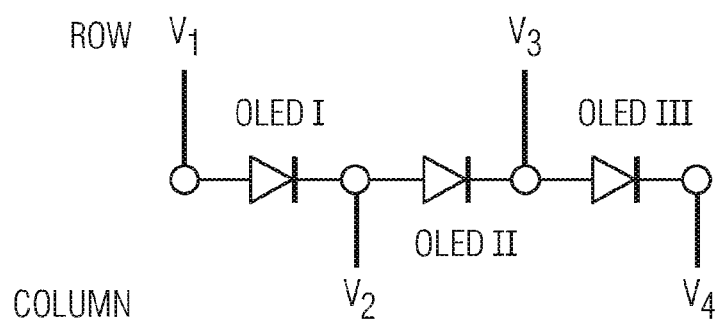

FIGS. 9A and 9B illustrate a simple example for controlling passive matrix controllable OLED stacks. An example of a portion of an array of display pixels 900 is shown for illustration purposes having only 9 OLED stacks and corresponding row and column electrodes that interconnect the respective OLEDs of the array. For ease of explanation, only the control of OLED stacks 911, 921 and 931 will be described in detail. However, a similar description applies to other OLED stacks in the array The OLED stacks of 911, 921 and 931 include three OLEDs and corresponding electrodes, however, the scheme illustrated in FIG. 9A will scale to any number of OLEDs in each OLED stack. It should be noted that transparent regions of the array of display pixels 900 are not shown for ease of description of the examples of FIGS. 9A and 9B.

The scheme of FIG. 9A shows an example of how four independent electrodes (2 row electrodes and 2 column electrodes) may be used to control a column of three OLED stacks 911, 921 and 931. In the example, when two row electrodes, such as V11, V111 in the top row R1 are driven by an input voltage of, for example, 11 volts and 3 volts, respectively, and at the same time, two column electrodes such as V29 and V49 in left column C1 are driven by input voltages of 8 volts and 0 volts, respectively. In response to the respective voltages, only the OLED stack 911 emits light because the OLED driving voltage for each OLED in the different stack layers is 3 volts, 5 volts, and 3 volts, respectively.

When two row electrodes in the middle row are driven by input voltage of 12 volt and 5 volt, respectively, and at the same time, two column electrodes in left column are driven by input voltage of 6 volt and 0 volt, respectively, only OLED 921 emits light because the OLED driving voltage for each OLED in the different stack layers is 6 volts, 1 volts, and 5 volts, respectively.

When two row electrodes in bottom row are driven by input voltage of 10 volts and 3 volts, respectively, and at the same time, two column electrodes in left column are driven by input voltage of 7 volts and 0 volts, respectively, only OLED 931 emits light because the OLED driving voltage for each OLED in the different stack layers is 3 volts, 4 volts, and 3 volts, respectively.

It is worth noting that only three (3) independent input voltages are required to drive a tandem OLED structure with three (3) layers of OLEDs. The fourth electrode could be always ground to ease the driving complexity and to reduce the number of driving channels required.

Different color and/or brightness for each display pixel can be tuned by the combination of 3 different operating voltages that may be directly controlled by 3 independent input voltages V1, V2, and V3 while V4 is always ground.

FIG. 9B illustrates a simple example for controlling stacked OLEDs, in a passive matrix controllable OLED display. For an OLED structure, such as that shown in FIG. 8A, with three (3) layers of OLED, there are four (4) independent electrodes whose input voltages are represented by V1, V2, V3, and V4, respectively. Each OLED emits light by applying a sufficient forward voltage, i.e. an input voltage at an anode of the OLED that is higher than the input voltage at cathode of the OLED. The voltage difference between the anode and the cathode is the applied operating voltage of the respective OLED. Output optical power can be tuned by tuning the operating voltage. In this case, the operating voltage of OLED I is V1 minus (−)V2. The operating voltage of OLED II is V2–V3. The operating voltage of OLED III is V3–V4. For example, when V1, V2, V3, V4 are 11 volts, 8 volts, 3 volts, 0 volts, respectively, the corresponding operating voltage for OLED I, II, and III is 3 volts, 5 volts, and 3 volts, respectively.

Figure 10:
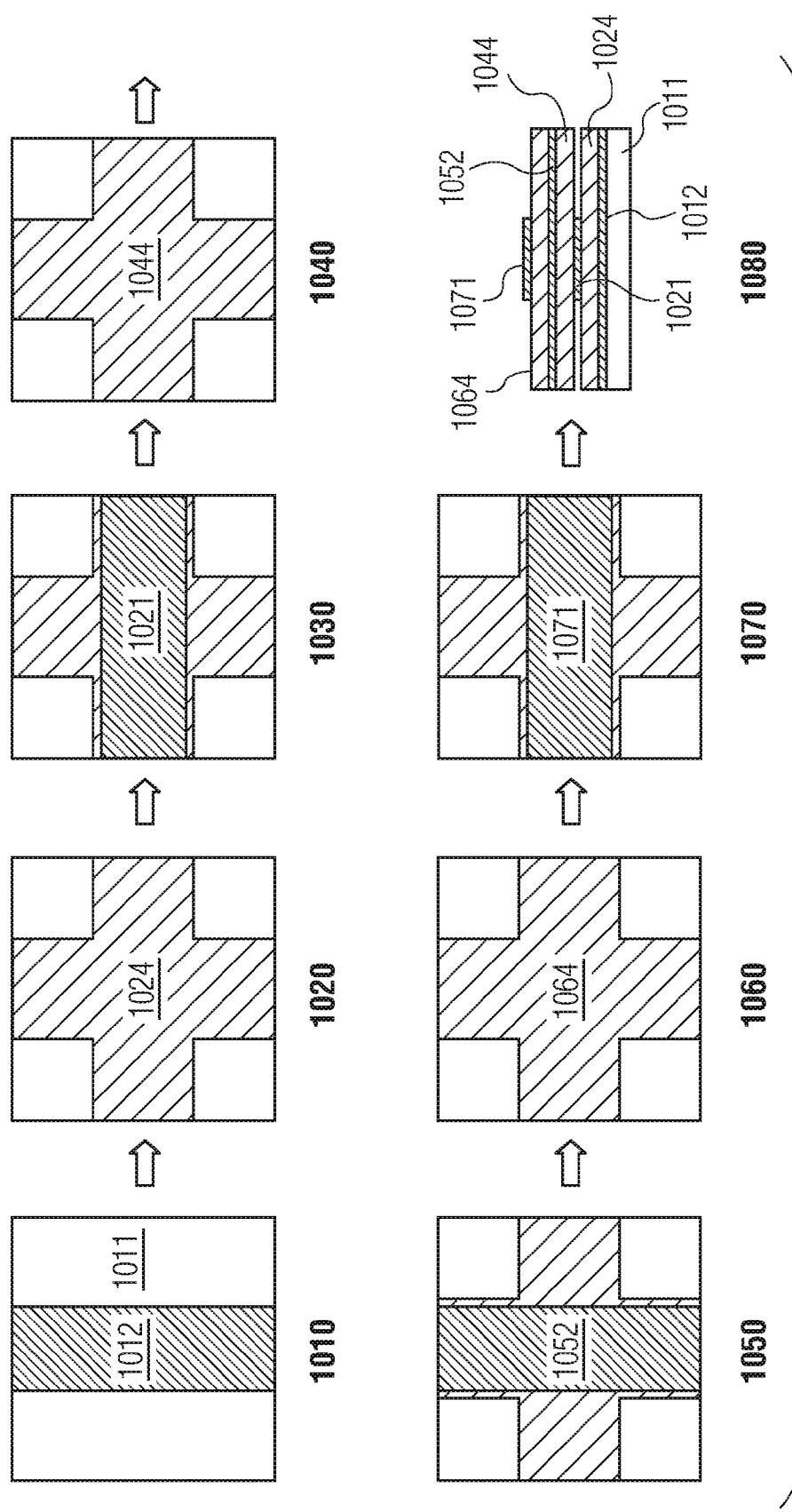
FIG. 10 illustrates a simplified example of a process for constructing a stacked OLED pixel, for use in a display pixel of a passive-matrix controllable OLED.

FIG. 10 illustrates a simplified example of a process for constructing a stacked, passive-matrix controllable OLED in a display pixel. In the simplified example, the process 1000 may begin at step 1010 by depositing on a substrate 1011 a first electrode 1012, which for ease of explanation will be referred to as row electrode. Although the substrate 1011 may be large, to support many OLED stacks, for convenience the drawing shows an area of a substrate approximately corresponding to the area of the display pixel that will include the OLED stack.

Upon the row electrode 1012 is deposited, at 1020, the layers forming a first OLED 1024 of an OLED stack. At step 1030, the first column electrode 1021 is deposited on the OLED 1024. Deposited, at 1040, over the column electrode 1021 is a second OLED 1044. As the process 1000 proceeds to step 1050, a second row electrode 1052 is deposited on the OLED 1044. Disposed on second row electrode 1052 at step 1060 is third OLED 1064. At step 1070, the second column electrode 1071 is deposited over the OLED 1064, which completes the OLED stack as shown at 1080. The OLED stack may be generated using techniques such as silk screening, inkjet printing, gravure printing techniques or the like.

Figure 11:
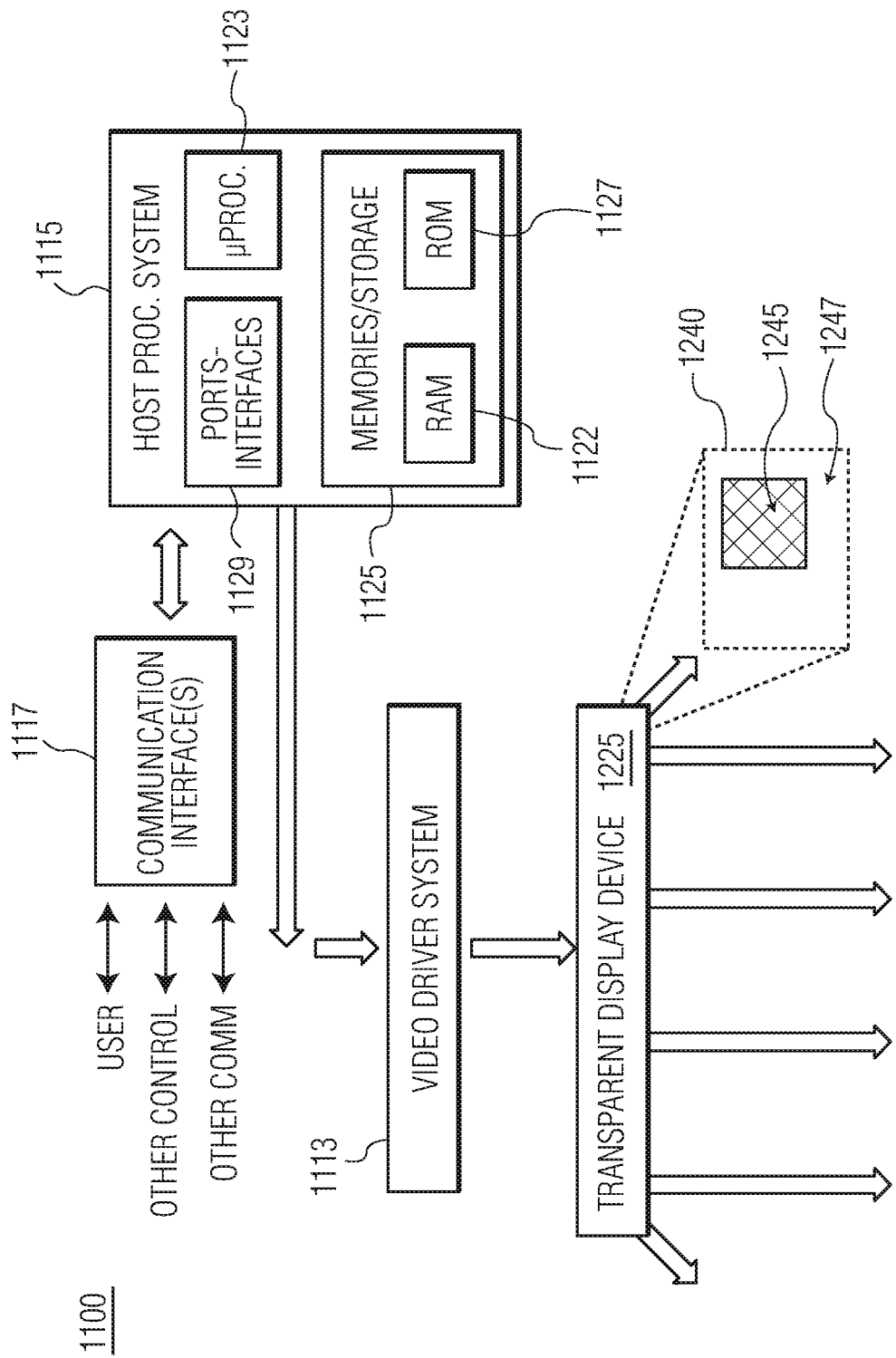
FIG. 11 is high-level functional block diagram of an example of a display device with associated driver and processing components.

FIG. 11 is high-level functional block diagram of an example of a display device with associated driver and processing components. The example device 1100 includes a host processing system 1115, communication interfaces 1117, a video driver system 1113, and a transparent display device 1225.

The transparent display 1225 is configured to output a display image. The transparent display device 1225 includes an array of display pixels, such as display pixel 1240. Each display pixel 1240 of the array of display pixels includes a number of separately controllable, organic light emitting devices (OLEDs) 1245 and one or more transparent areas 1247 adjacent to the OLEDs 1245 of the display pixel 1240. The transparent areas 1247 are formed from a transparent material, such as glass or other material that provide similar optical performance. For example, if the glass or the like is used as a substrate for the display panel, the OLEDs 1245 occupy limited areas; and regions of the transparent substrate in-between as the transparent regions or areas of the display pixel of the panel.

At a high-level, the transparent display device 1225 outputs a display image in response to control signals received from the driver system 1113. The displayed image may be a real scene, a computer generated scene, a single color, a collage of colors, a video stream, or the like. In addition or alternatively, the image data may be provided to the transparent display device 1225 from an external source(s) (not shown), such as a remote server or an external memory device via one or more of the communication interfaces 1117. In addition to the display function, the transparency of the device 1225 allows light to pass through the device 1225. For example, when viewing a displayed image, a viewer can also see objects behind the device 1225 through the device 1225.

The functions of transparent display device 1225 are controlled by the control signals received from the driver system 1131. The driver system 111A may deliver the image data directly to the transparent display device 1225 for presentation or may convert the image data into a format suitable for delivery to the transparent display device 1225. The image information for presentation on the display device 225 may be provided separately, e.g. as a separate image file or as a video stream. The processor 1123 by accessing programming and using a software configuration information stored in the storage/memories 1125, controls operation of the video driver system 1113. For example, the processor 123A obtains distribution control data from ROM 1127 or RAM 1122 and uses that data to control the video driver system 1113 to cause the display of an image via the transparent display device 1225.

FIG. 11 also provides an example of an implementation of the high layer logic and communications elements and to provide an output image. The host processing system 1115 provides the high level logic or "brain" of the device 1100. In the example, the host processing system 1115 includes data storage/memories 1125, such as a random access memory 1122 and/or a read-only memory 1127, as well as programs stored in one or more of the data storage/memories 125A. The data storage/memories 1125 store various data. The host processing system 1115 also includes a central processing unit (CPU), shown by way of example as the microprocessor (μP) 123A, although other processor hardware may serve as the CPU.

The ports and/or interfaces 1129 couple the microprocessor 1123 to various elements of the device 1100 logically outside the host processing system 1115, such as the video driver system 1113, and the communication interface(s) 1117. For example, the processor 1123 by accessing programming in the memory 1125 controls operation of the video driver system 1113 and other operations of the device 1100 via one or more of the ports and/or interfaces 1129. In a similar fashion, one or more of the ports and/or interfaces 1129 enable the processor 1123 of the host processing system 1115 to use and communicate externally via the interfaces 1117.

As noted, the host processing system 1115 is coupled to the communication interface(s) 1117. In the example, the communication interface(s) 1117 offer a user interface function or communication with hardware elements providing a user interface for the device 1100. The communication interface(s) 1117 may communicate with other control elements, for example, a host computer of an image or media content provider server, an external media device or the like. The communication interface(s) 117A may also support device communication with a variety of other systems of other parties, e.g. the device manufacturer for updated or an on-line server for downloading of digital media content, image data, or the like.

Specific examples and additional details of the luminaires, light sources, and spatial modulators as well as associated driver, control and communication components, e.g. for use in software configurable luminaires, may be found in applicant's related applications, U.S. Provisional Applications Nos. 62/193,859; 62/193,870; 62/193,874; 62/204,606; 62/209,546; and 62/262,071, which are all incorporated in their entirety herein by reference.

The term "coupled" as used herein refers to any logical, physical or electrical connection, link or the like by which signals produced by one system element are imparted to another "coupled" element. Unless described otherwise, coupled elements or devices are not necessarily directly connected to one another and may be separated by intermediate components, elements or communication media that may modify, manipulate or carry the signals.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," "includes," "including," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "a" or "an" does not, without further constraints, preclude the existence of additional identical elements in the process, method, article, or apparatus that comprises the element.

Unless otherwise stated, any and all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present concepts.

What is claimed is:

1. A transparent display panel, comprising:
   (a) an array of display pixels configured on a same substrate, wherein the array has horizontal and vertical dimensions on the substrate and each respective display pixel of the array comprises:
   a plurality of separately controllable organic light emitting diodes (OLEDs), each of the OLEDs configured one upon another to form an OLED stack on the substrate, wherein each separately controllable OLED is constructed to emit visible light of a different respective one of three colors,
   a first of the plurality of OLEDs being stacked on a light emitting surface of a second of the plurality of OLEDs and the second of plurality of OLEDs being stacked on a light emitting surface of a third of the plurality of OLEDs so that: light from a light emitting surface of the third OLED passes through the second and first OLEDs, light from a light emitting surface of the second OLED passes through the first OLED, and light emerging from a light emitting surface of the first OLED includes light emitted by the first OLED as well as light emitted by the second and third OLEDs; and
   (b) a transparent region on the substrate adjacent to the OLED stack of the respective display pixel, wherein the transparent region is configured horizontally and vertically on the substrate in-between the OLED stack of the respective display pixel and the OLED stack of at least another adjacent display pixel in the array, and is formed from a transparent material.

2. The transparent display panel of claim 1, wherein at least one of the plurality of separately controllable OLEDs includes a tandem stack of two OLEDs constructed to emit visible light of the respective one of the three different colors.

3. The transparent display panel of claim 1, wherein:
   each respective display pixel of the array of display pixels includes transistor circuits associated with the respective display pixel to activate the OLEDs of the respective display pixel; and
   the array further includes interconnections to the transistor circuits to configure the array as an active matrix OLED array of display pixels.

4. The transparent display panel of claim 3, wherein the transistor circuits and interconnections of each of the respective OLEDs in the OLED stack are positioned over other transistor circuits and interconnections of another OLED in the OLED stack.

5. The transparent display panel of claim 1, wherein the array of display pixels includes:
   a plurality of electrodes interconnecting each OLED in the OLED stack of each respective display pixel in the array to form a passive matrix array, wherein each OLED in the respective display pixels in the passive matrix array includes:
   a first electrode coupled to a first side of the OLED; and
   a second electrode coupled to a second side of the OLED, wherein the OLED is activated by electrical current passing between the first electrode and the second electrode.

6. The transparent display panel of claim 1, wherein the OLEDs in the OLED stack are coupled via a matrix of electrodes connected to opposing sides of each OLED in the OLED stack to facilitate activation of the respective OLED.

7. The transparent display panel of claim 6, wherein each electrode in the matrix of electrodes has a width that is substantially equivalent to or smaller than a width of a light emitting region of each respective OLED.

8. A transparent display panel, comprising:
   (a) an array of display pixels configured on a same substrate, wherein the array has horizontal and vertical dimensions on the substrate and each respective display pixel of the array comprises three separately controllable organic light emitting diodes (OLEDs), each of the OLEDs being configured one upon another to form an OLED stack on the substrate and constructed to emit visible light of a different respective one of three colors; and (b) a transparent region on the substrate adjacent to the OLED stack of the respective display pixel, wherein the transparent region of the respective display panel is configured horizontally and vertically on the substrate in-between the OLED stack of the respective display pixel and the OLED stack of at least another adjacent display pixel in the array;

wherein the display pixels are structured so that the transparent display panel exhibits an overall optical transmissivity with respect to at least the three colors of light of 50% or more.

9. The display panel of claim 8, transparent display panel, wherein in each display pixel of the array, at least one of the three OLEDS comprises a tandem stack of two OLEDs constructed to emit visible light of the respective one of the three different colors.

10. The transparent display of claim 8, wherein the three separately controllable OLEDs, comprises:
a first organic light emitting device (OLED) having a first color, a second OLED having a second color, a third OLED coupled in a stacked orientation; and
an electrical connection connecting the first OLED, the second OLED, and the third OLED together in series, wherein the electrical connection applies a voltage across the first OLED, the second OLED, and the third OLED.

11. The transparent display panel of claim 8, wherein in each pixel of the array, another one of the three OLEDS comprises a tandem stack of two OLEDs of constructed to emit visible light of the same one of the three colors.

12. The transparent display panel of claim 8, wherein a ratio of percentage of pixel area occupied by the OLED stack to percentage of pixel area occupied by the transparent area is less than or equal to 80%:20%.

13. The transparent display panel of claim 8, wherein a ratio of percentage of pixel area occupied by the OLED stack to percentage of pixel area occupied by the transparent area is approximately equal to 20%:80%.

14. The transparent display panel of claim 8, wherein the display pixels are structured so that the transparent display panel exhibits an overall optical transmissivity with respect to at least the three colors of light of 60% or more.

15. The transparent display panel of claim 14, wherein the display pixels are structured so that the transparent display panel exhibits an overall optical transmissivity with respect to at least the three colors of light of 70% or more.

16. The transparent display panel of claim 15, wherein the display pixels are structured so that the transparent display panel exhibits an overall optical transmissivity with respect to at least the three colors of light of 80% or more.

17. The transparent display panel of claim 16, wherein the display pixels are structured so that the transparent display panel exhibits an overall optical transmissivity with respect to at least the three colors of light of approximately 85% or more.

18. A stacked light emitting device, comprising:
a substrate;
a first electrode disposed on the substrate;
a first organic light emitting device (OLED) disposed over the substrate and electrically coupled to the first electrode;
a second electrode disposed over the first OLED and electrically coupled to the first OLED;
a second OLED disposed over the second electrode and electrically coupled to the second electrode;
a third electrode disposed over the second OLED and electrically coupled to the second OLED;
a third OLED disposed over the third electrode and electrically coupled to the third electrode; and
a fourth electrode disposed over the third OLED and electrically coupled to the third OLED,
wherein the first, second, and third OLEDs are configured to form an OLED stack on a same substrate, and each of the OLEDs emit light of one of three different colors, and
wherein a transparent region, formed from a transparent material, is configured horizontally and vertically on the substrate in-between the OLED stack and at least another adjacent OLED stack on the substrate.

19. The stacked light emitting device of claim 18, further comprising:
a charge generation layer disposed over the third OLED; and
a fourth OLED disposed over the charge generation layer, wherein:
both the charge generation layer and the fourth OLED are disposed between the fourth electrode and the third electrode, and
the third OLED and the fourth OLED output light of the same color.

20. The stacked light emitting device of claim 19, further comprising:
a reflective layer disposed either on a side of the fourth electrode opposite the third OLED or on a side of the first electrode.

* * * * *